(12) United States Patent
Zhang et al.

(10) Patent No.: US 7,148,094 B2
(45) Date of Patent: Dec. 12, 2006

(54) SEMICONDUCTOR DEVICE AND METHOD FOR ITS PREPARATION

(75) Inventors: Hongyong Zhang, Yamato (JP); Toru Takayama, Yokohama (JP); Yasuhiko Takemura, Atsugi (JP); Akiharu Miyanaga, Hadano (JP); Hisashi Ohtani, Isehara (JP); Junichi Takeyama, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 126 days.

(21) Appl. No.: 10/808,353

(22) Filed: Mar. 25, 2004

(65) Prior Publication Data

US 2004/0180477 A1  Sep. 16, 2004

Related U.S. Application Data

(60) Division of application No. 09/222,185, filed on Dec. 29, 1998, now Pat. No. 6,730,549, which is a division of application No. 08/911,912, filed on Aug. 15, 1997, now Pat. No. 5,882,960, which is a continuation of application No. 08/263,351, filed on Jun. 21, 1994, now abandoned.

(30) Foreign Application Priority Data

Jun. 25, 1993 (JP) ............................... 5-180752
Feb. 8, 1994 (JP) ............................... 6-036616

(51) Int. Cl.
*H01L 21/336* (2006.01)
*H01L 21/84* (2006.01)

(52) U.S. Cl. ..................................... 438/166

(58) Field of Classification Search ................ 438/166
See application file for complete search history.

(56) References Cited

U.S. PATENT DOCUMENTS

| 4,136,434 A | 1/1979 | Thibault et al. |
| 4,305,200 A | 12/1981 | Fu et al. |
| 4,597,160 A | 7/1986 | Ipri |
| 4,604,150 A | 8/1986 | Lin |
| 4,693,759 A | 9/1987 | Noguchi et al. |
| 4,822,752 A | 4/1989 | Sugahara et al. |
| 4,918,028 A | 4/1990 | Shirai |
| 4,942,441 A | 7/1990 | Konishi et al. |
| 5,100,815 A | 3/1992 | Tsubone et al. |

(Continued)

FOREIGN PATENT DOCUMENTS

EP          0 612 102       8/1994

(Continued)

OTHER PUBLICATIONS

English Translation of Japanese Patent Office Communication about Claim Rejection of Corresponding Japanese Patent Application.

(Continued)

*Primary Examiner*—M. Wilczewski
(74) *Attorney, Agent, or Firm*—Eric J. Robinson; Robinson Intellectual Property Law Office, P.C.

(57) ABSTRACT

A semiconductor device is disclosed. The semiconductor device has a crystalline silicon film as an active layer region. The crystalline silicon film has needle-like or columnar crystals oriented parallel to the substrate and having a crystal growth direction of (111) axis. A method for preparing the semiconductor device comprises steps of adding a catalytic element to an amorphous silicon film; and heating the amorphous silicon film containing the catalytic element at a low temperature to crystallize the silicon film.

12 Claims, 19 Drawing Sheets

U.S. PATENT DOCUMENTS

| | | |
|---|---|---|
| 5,147,826 A | 9/1992 | Liu et al. |
| 5,153,702 A | 10/1992 | Aoyama et al. |
| 5,212,397 A | 5/1993 | See et al. |
| 5,275,851 A | 1/1994 | Fonash et al. |
| 5,278,093 A | 1/1994 | Yonehara |
| 5,313,075 A | 5/1994 | Zhang et al. |
| 5,322,807 A | 6/1994 | Chen et al. |
| 5,372,958 A | 12/1994 | Miyasaka et al. |
| 5,463,254 A | 10/1995 | Iyer et al. |
| 5,485,019 A | 1/1996 | Yamazaki et al. |
| 5,582,640 A | 12/1996 | Okada et al. |
| 5,587,330 A | 12/1996 | Yamazaki |
| 5,600,169 A | 2/1997 | Burgener et al. |
| 5,612,251 A | 3/1997 | Lee |
| 5,620,910 A | 4/1997 | Teramoto |
| 5,639,698 A | 6/1997 | Yamazaki et al. |
| 5,773,325 A | 6/1998 | Teramoto |
| 5,882,960 A | 3/1999 | Zhang et al. |
| 5,895,933 A | 4/1999 | Zhang et al. |
| 6,376,860 B1 | 4/2002 | Mitanaga et al. |
| 2004/0180477 A1 | 9/2004 | Zhang et al. ............... 438/149 |

FOREIGN PATENT DOCUMENTS

| | | |
|---|---|---|
| EP | 0 631 325 | 12/1994 |
| EP | 1 026 751 | 8/2000 |
| EP | 1 026 752 | 8/2000 |
| EP | 0 631 325 | 5/2003 |
| JP | 58-068923 | 4/1983 |
| JP | 59-028327 | 2/1984 |
| JP | 60-136304 | 7/1985 |
| JP | 61-063017 | 4/1986 |
| JP | 63-030776 | 2/1988 |
| JP | 63-307776 | 12/1988 |
| JP | 64-027222 | 1/1989 |
| JP | 01-132115 | 5/1989 |
| JP | 01-132116 | 5/1989 |
| JP | 02-032527 | 2/1990 |
| JP | 02-140915 | 5/1990 |
| JP | 02-143415 | 6/1990 |
| JP | 02-148831 | 6/1990 |
| JP | 03-185874 | 8/1991 |
| JP | 03-218640 | 9/1991 |
| JP | 03-227525 | 10/1991 |
| JP | 03-290924 | 12/1991 |
| JP | 04-022120 | 1/1992 |
| JP | 04-180219 | 6/1992 |
| JP | 05-041519 | 2/1993 |
| JP | 05-067635 | 3/1993 |
| JP | 05-082442 | 4/1993 |
| WO | WO 92-01089 | 1/1992 |

OTHER PUBLICATIONS

Caune et al., "Combined CW Laser and Furnace Annealing of Amorphous Si and Ge in Contact With Some Metals," Applied Surface Science, vol. 36, 1989, pp. 597-604.

C. Hayzelden et al., "*In Situ* Transmission Electron Microscopy Studies of Silicide-Mediated Crystallization of Amorphous Silicon," (3 pages).

A. V. Dvurechenskii et al., "Transport Phenomena in Amorphous Silicon Doped by Ion Implantation of 3d Metals," *Akademikian Lavrentev Prospekt* 13, 630090 Novosibirsk 90, USR, pp. 635-640.

T. Hempel et al., "Needle-Like Crystallization of Ni Doped Amorphous Silicon Thin Films," *Solid State Communications*, vol. 85, No. 11, pp. 921-924, 1993.

Kakkad et al., "Crystallized Si-Films By Low-Temperature Rapid Thermal Annealing of Amorphous Silicon," Mar. 1, 1989, pp. 2069-2072, J. Appl. Phys. 65(5).

Kakkad et al., "Low Temperature Selective Crystallization of Amorphous Silicon," 1989, pp. 66-68, Journal of Non-Crystalline Solids, 115.

Liu et al., "Polycrystalline Silicon Thin Film Transistors on Corning 7059 Glass Substrates Using Short Time, Low-Temperature Processing," May 17, 1993, pp. 2554-2556, Appl. Phys. Lett. 62(20).

Liu et al., "Selective Area Crystallization of Amorphous Silicon Films by Low-Temperature Rapid Thermal Annealing," Aug. 14, 1989, pp. 660-662, Appl. Phys. Lett 55(7).

Hayzelden et al., "Silicide Formation and Silicide-Mediated Crystallization of Nickel-Implanted Amorphous Silicon Thin Films," J. Appl. Phys., vol. 73, No. 12, Jun. 15, 1993.

Schoenfeld et al., "Crystallization of Amorphous Silicon by NiSi2 Precipitates," Thin Solid Films 261, 1995, pp. 236-240.

Batstone et al., "In Situ TEM Studies of the Crystallization of Amorphous Silicon: The Role of Silicides," Microscopy of Semiconducting Materials 1993, pp. 165-172.

Bonnel et al., "Polycrystalline Silicon Thin-Film Transistors with Two-Step Annealing Process," IEEE Electron Device Letters, vol. 14, No. 12, Dec. 1993, pp. 551-553.

Wolf et al., "Silicon Processing For the VLSI ERA," vol. 1: Process Technology, pp. 216-218.

European Search Report dated Oct. 2, 2002.

Communication Pursuant to Article 96(2) EPC, European Patent Office, Jun. 30, 2003.

C. Hayzelden et al., "*In Situ* Transmission Electron Microscopy Studies of Silicide-Mediated Crystallization of Amorphous Silicon," vol. 60, No. 2, pp. 225-227.

Hayzelden et al., "Silicide Formation and Silicide-Mediated Crystallization of Nickel-Implanted Amorphous Silicon Thin Films," J. Appl. Phys., vol. 73, No. 12, Jun. 15, 1993, pp. 8279-8289.

FILM THICKNESS:800Å
PLASMA TREATED

US 7,148,094 B2

SEMICONDUCTOR DEVICE AND METHOD FOR ITS PREPARATION

BACKGROUND OF THE INVENTION

1. Field of the Invention

The present invention relates to a semiconductor device which has a TFT (thin-film transistor) built onto an insulating substrate made of glass or the like, and to a method for its preparation.

2. Description of the Prior Art

Thin-film transistors (hereunder, TFTs) are known which employ thin-film semiconductors. These TFTs are constructed by forming a thin-film semiconductor on a substrate and using the thin-film semiconductor. These TFTs are used in various integrated circuits, but particular attention is being given to their use in electrooptical devices, especially as switching elements constructed for the respective picture elements of active matrix-type liquid crystal displays and driving elements formed in peripheral circuit sections.

The TFTs used in these devices generally employ thin-film silicon semiconductors. Thin-film silicon semiconductors are largely classified into two types: amorphous silicon semiconductors (a-Si) and silicon semiconductors with crystallinity. Amorphous silicon semiconductors have a low preparation temperature, they may be relatively easily prepared by a vapor phase process, and they lend themselves well to mass preparation, for which reasons they are the most widely used type; however, their physical properties such as conductivity, etc. are inferior in comparison with those of silicon semiconductors with crystallinity, and thus ardent attempts to establish new methods of preparing silicon semiconductor TFTs with crystallinity have been made in order to obtain more high-speed properties in the future. As crystalline silicon semiconductors, there are known polycrystalline silicon, microcrystalline silicon, amorphous silicon which also contains crystalline components, and semi-amorphous silicon in an intermediate state between crystalline and amorphous solids.

The following methods are known for obtaining thin-film silicon semiconductors with crystallinity:

(1) Direct formation of a crystalline film at the time of its formation.
(2) Formation of an amorphous semiconductor film to which crystallinity is then imparted using the energy of laser light.
(3) Formation of an amorphous semiconductor film to which a crystallinity is then imparted by adding heat energy.

However, in method (1), it is technically difficult to form a uniform film with satisfactory semiconducting properties over the entire surface of the substrate, while another drawback is the cost, since with the film forming temperature being as high as 600° C. or above inexpensive glass substrates cannot be used. In method (2), there is first the problem of a small irradiation area of laser light, such as that from an excimer laser which is the type most generally used at the present time, resulting in a low throughput, while the stability of the laser is not sufficient for uniform processing of the entire surface of large-surface-area substrates, and thus the method is thought to be a next-generation technique. Method (3) has a relative advantage over methods (1) and (2) in that it is suitable for large surface areas, but it also requires high heating temperatures of 600° C. and above, and thus it is necessary to lower the heating temperature when using low-cost glass substrates. Particularly, in the case of liquid crystal displays presently in use there is a continuous drive toward large-size screens, and consequently the use of large-size glass substrates is also necessary. When large-size glass substrates are employed in this manner, shrinkage and warping which occur during the heating process indispensable to the preparation of the semiconductors result in lower precision of mask alignment, etc., and thus a major problem is inherent. Particularly, in the case of 7059 glass which is presently the most widely used type of glass, the warping point is 593° C. and consequently major deformities are caused with the conventional processes for heat crystallization. In addition to the problem of temperature, the heating time required for crystallization in the existing processes often reaches a few dozen hours or more, and thus a further shortening of this time is necessary.

A greater problem is that fact that, since silicon thin films with crystallinity prepared by these methods depend on coincidental generation of nuclei and crystal growth therefrom, it has been practically impossible to control the particle size, orientation, etc. Many numerous attempts to control these have been made up to the present time, and as an example thereof there may be mentioned the patented invention described in Japanese Patent Application Publication HEI No. 5-71993. Nevertheless, at present, methods such as the one described in this patent publication still use coincidentally generated nuclei within a restricted range, and therefore at present control of the orientation of the film has not been complete, and there has been absolutely no control of the particle size.

SUMMARY OF THE INVENTION

The present invention provides a means of overcoming the above mentioned problems. More specifically, its purpose is to provide a process which both lowers the temperature and shortens the time required for crystallization, in methods for the preparation of crystalline silicon semiconductor thin films that involve heat crystallization of a thin film of amorphous silicon. It need not be mentioned, of course, that a crystalline silicon semiconductor prepared using the process provided by the present invention has equal or superior physical properties in comparison with one prepared according to the prior art, and that it may also be used for the active layer region of a TFT.

More specifically, there is provided a new method of preparing crystalline silicon thin-films which will supersede the conventional method using coincidental nuclei generation, and it is a method of preparing crystalline silicon thin-films with sufficient productivity at relatively low temperatures, which allows control of the particle size and a rather high degree of control of the orientation.

DETAILED DESCRIPTION OF THE INVENTION

Figure 1:
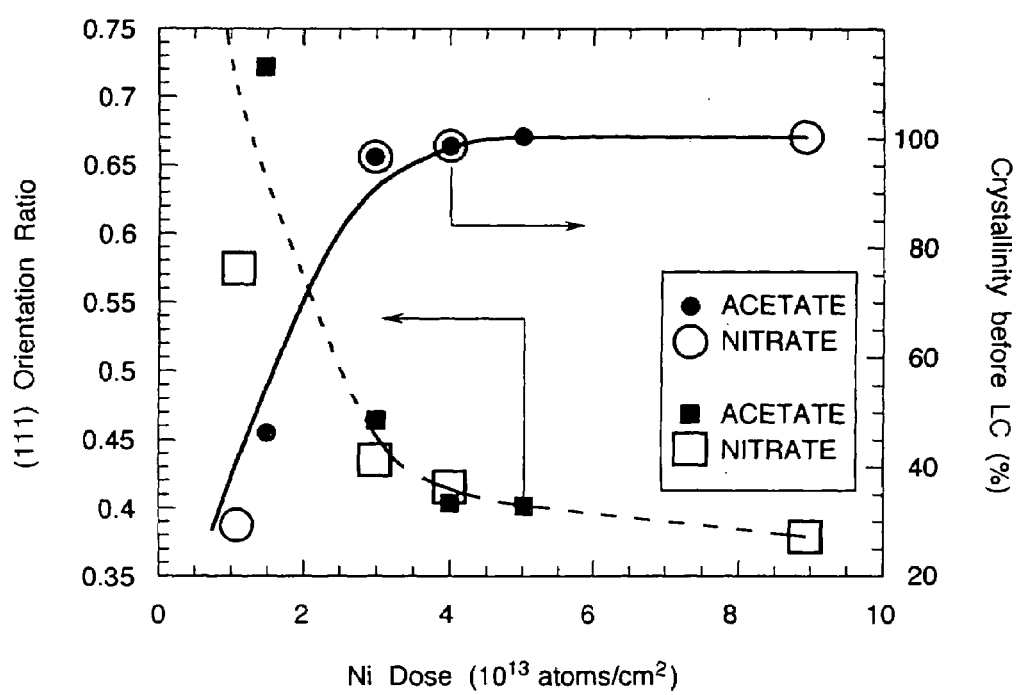
FIG. 1 shows the dependence of the orientation on the catalytic element concentration in a crystalline silicon film.

We the present inventors have carried out the following experiments and observations regarding methods of promoting heat crystallization and methods of controlling particle sizes and orientation, in order to overcome the problems involved in crystallization of amorphous silicon such as described above under Description of the Prior Art.

A description will first be given regarding a method of promoting heat crystallization.

First, upon investigation of the mechanism for the formation of an amorphous silicon film on a glass substrate and the crystallization of the film by heating, as an experimental fact it was found that the crystal growth begins at the interface between the glass substrate and the amorphous silicon, and up to a certain film thickness it proceeds in a vertical columnar manner with respect to the surface of the substrate.

The above phenomenon is believed to be a result of the presence of crystal nuclei which become the base of crystal growth (seeds which become the base of crystal growth) at the interface between the glass substrate and the amorphous silicon film, and of the growth of crystals from the nuclei. These crystal nuclei are thought to be a contaminant metallic element present in trace amounts on the surface of the substrate or crystal components on the glass surface (as indicated by the expression "crystallized glass", silicon oxide crystal components are present on the surface of glass substrates) or formed by stress.

Here, it was thought that the temperature of crystallization might be lowered by more active introduction of crystal nuclei, and to confirm this effect we attempted an experiment in which films of trace amounts of other metals were formed on substrates, and then thin films of amorphous silicon were formed thereon, and heating was performed for crystallization. As a result, in certain cases where a film containing several metals was formed on the substrate, a lowering in the crystallization temperature was confirmed, and it was presumed that crystal growth had occurred with the foreign matter as the crystal nuclei. Thus we investigated in more detail the mechanism by which the use of the various metal impurities resulted in a lowered temperature.

Crystallization may be thought of as comprising the two stages of initial preparation of nuclei and the crystal growth from the nuclei. Here, the rate of the initial preparation of the nuclei is found by measuring the time until the generation of minute dotted crystals at a constant temperature, and this time was shortened in all cases of thin films in which the above mentioned metal impurity film had been formed, while it was also confirmed that the introduction of crystal nuclei had the effect of lowering the crystallization temperature. Also, quite unexpectedly, when variations were made in the heating time for growth of the crystal grains after preparation of the nuclei, it was found that there was even a dramatic increase in the rate of crystal growth after preparation of the nuclei in case of crystallization of an amorphous silicon thin films formed on films of certain types of metals. A detailed explanation of this mechanism will be given later.

In any case it was found that, as a result of the two effects mentioned above, when certain types of metals in trace amounts are used to form a film on which a thin film made of amorphous silicon is formed and then heated for crystallization, sufficient crystallization is achieved at temperatures of 580° C. and below for a period of about 4 hours, a fact which could not be foreseen according to the prior art. Of the impurity metals having such an effect, we selected nickel, as its effect is the most notable.

As an example of the degree of the effect provided by nickel, when on an untreated substrate (Corning 7059), i.e. one on which no thin film of trace nickel had been formed, a thin film of amorphous silicon formed by the plasma CVD method was heated in a nitrogen atmosphere for crystallization, a heating temperature of 600° C. required a heating time of 10 hours or more. However, when an amorphous silicon thin film was used on a substrate on which had been formed a thin film of trace nickel, a similar crystalline state could be obtained with only about 4 hours of heating. Raman spectroscopy was used for the judgment of this crystallization. From this alone, it is clear that the effect of nickel is exceptional.

As is clear from the above explanation, if an amorphous silicon thin film is formed on a thin film formed using a trace amount of nickel, then it becomes possible to lower the crystallization temperature and shorten the time required for crystallization. Here, a more detailed explanation will be provided with the assumption that the process is used for the preparation of a TFT. The description will be more specific later, but the same effect is achieved not only when a thin film of nickel is formed on the substrate, but also when it is formed on the amorphous silicon, and also with ion implantation or the like, and therefore hereunder in the present specification all of these successive treatments will be called "addition of a trace amount of nickel".

First an explanation will be given regarding a method for the trace addition of nickel. Clearly, for the trace addition of nickel, the same temperature-lowering effect is provided either by a method of forming a thin film containing a trace of nickel on a substrate and then forming thereon an amorphous silicon film, or by a method of first forming the amorphous silicon film and then forming the thin film containing a trace of nickel, and the formation of the films may be by sputtering, vapor deposition or plasma treatment, and thus it has been found that the effect is accomplished regardless of the film-forming method. Plasma treatment refers to a process in which a material containing a catalytic element is used as the electrodes in a flat parallel-type or positive glow column-type plasma CVD apparatus, and plasma is generated in an atmosphere of nitrogen, hydrogen, etc. for addition of the catalytic element to the amorphous silicon film.

However, if a thin film containing a trace of nickel is formed on a substrate, then rather than directly forming on a 7059 glass substrate a thin film containing a trace of nickel, the effect is more notable if a silicon oxide thin film is first formed on the substrate and the thin film containing a trace of nickel is formed over it. One of the reasons that may be imagined for this is that direct contact between the silicon and the nickel is essential for the present low temperature crystallization, and it is thought that in the case of 7059 glass, components other than silicon might interfere with the contact or reaction between the silicon and the nickel.

Also, roughly the same effect was confirmed when the method used for the trace addition of nickel did not involve formation of a thin film in contact with the top or bottom of the amorphous silicon, but rather addition by ion implantation.

Regarding the amount of the nickel, a lower temperature was confirmed with addition of an amount of $1\times10^{15}$ atoms/$cm^3$ or more, but addition of amounts of $1\times10^{21}$ atoms/$cm^3$ or more resulted in peaks of Raman spectrum whose shape clearly differed in comparison with simple silicon, and therefore it is thought that the practical range is $1\times10^{15}$ atoms/$cm^3$ to $5\times10^{19}$ atoms/$cm^3$. Further, considering the physical properties of a semiconductor to be used as the active layer of a TFT, this amount must be kept to within $1\times10^{15}$ atoms/$cm^3$ to $1\times10^{19}$ atoms/$cm^3$.

Nevertheless, the presence of a large amount of an element such as mentioned above in a semiconductor is not preferred because it will reduce the reliability and electrical stability of a device using such a semiconductor.

In other words, the above mentioned crystallization-promoting element such as nickel (in the present specification, the crystallization-promoting element is referred to as "catalytic element") is necessary for crystallization of the amorphous silicon, but is preferably as little as possible contained in the crystallized silicon. In order to achieve this, an element having an extremely inactive tendency in the crystalline silicon is selected as the catalytic element, and the amount of the catalytic element introduced is reduced to be as small as possible, that is, crystallization is carried out with a minimun amount of catalytic element. Regarding this amount, it has been found that if the nickel concentration of the active layer is not $1\times10^{19}$ atoms/$cm^3$ or lower then an adverse effect on the properties of the device will result. For this reason, the above dose of the catalytic element must be strictly controlled when introduced.

In addition, when an amorphous silicon film was formed and then nickel was added as the catalytic element by plasma treatment to prepare a crystalline silicon film, the following points have become apparent upon detailed investigation of the crystallization process, etc.

(1) When nickel is introduced onto the amorphous silicon film by plasma treatment, the nickel penetrates through a considerable thickness into the amorphous silicon film even prior to heat treatment.
(2) The initial generation of crystal nuclei occurs from the surface on which the nickel was introduced.
(3) Even if nickel is used to form the film on the amorphous silicon film by vapor deposition, crystallization occurs in the same manner as with plasma treatment.

From the above points, it may be concluded that not all of the nickel introduced by plasma treatment is effectively useful. That is, even if a large amount of nickel is introduced, it is thought that some nickel is present which is not sufficiently useful. From this, it is believed that the point (surface) of contact between the nickel and the silicon is the key to low temperature crystallization. Accordingly, it may be concluded that the nickel must be minutely distributed in a discrete manner to the greatest degree possible. That is, it may be concluded that "What is necessary is that introduction of nickel with concentration as low as possible within the possible range is made by its dispersion in a discrete manner near the surface of the amorphous silicon film."

As a method of introducing the trace amount of nickel into only the region near the surface of the amorphous silicon film, i.e. a method for trace addition of the crystallization-promoting catalytic element into only the region near the surface of the amorphous silicon film, there may be mentioned the vapor deposition process; however, the vapor deposition process is disadvantaged by poor controllability and difficulty in strictly controlling the amount of the catalytic element introduced.

Furthermore, since the amount of the catalytic element introduced must be as small as possible there often results the problem of unsatisfactory crystallization, and thus it is important to appropriately adjust the amount of the catalytic element. As a means of solving these problems, the present inventors have invented a method of adding the catalytic element using a solution, although a detailed description thereof is omitted in the present specification. By using this method, it has been revealed that the concentration of the catalytic element may be controlled within a range of $1\times10^{16}$ atoms/$cm^3$ to $1\times10^{19}$ atoms/$cm^3$. Also, as a result of investigation by the present inventors, it has been found that as a catalytic element other than nickel which provides the same effect there may be used one or more elements selected from the group consisting of Pd, Pt, Cu, Ag, Au, In, Sn, Pb, As and Sb.

The characteristics of crystal growth and crystalline form when a trace amount of nickel is added will now be discussed, with an additional explanation of the mechanism of crystallization assumed on the basis thereof.

As described above, it has been reported that if no nickel is added, then nuclei are randomly generated from the crystal nuclei on the interface with the substrate, etc., and the crystal growth from these nuclei is likewise random, and that crystals which are relatively (110) or (111) oriented are obtained depending on the method of preparation, and as a natural consequence crystal growth which is roughly uniform over the entire thin film is observed.

First, in order to determine the mechanism, an analysis was made with a DSC (differential scanning calorimeter). An amorphous silicon thin film formed on a substrate by plasma CVD was placed with the substrate in a specimen container, and the temperature was raised at a constant rate. Distinct exothermic peaks were observed at about 700° C., and crystallization was observed. Naturally, this temperature shifted when the temperature-raising rate was changed, and when the rate was, for example, 10° C./min crystallization started at 700.9° C. Next, measurements were made with three different temperature-raising rates, and the activation energies of the crystal growth after the initial generation of nuclei were determined by the Ozawa method. This resulted in a value of about 3.04 eV. Also, when the reaction rate equation was determined by fitting with the theoretical curve, it was found to be most easily explainable by a model of disorderly generation of nuclei and growth therefrom, thus confirming the propriety of the model in which nuclei are generated randomly from crystal nuclei on the interface with the substrate, etc., and crystal growth occurs from these nuclei.

Measurements completely identical to those mentioned above were also made with addition of a trace amount of nickel. This resulted in initiation of crystallization at 619.9° C. with a temperature-raising rate of 10° C./min, and the activation energy for the crystal growth determined by a series of these measurements was about 1.87 eV, thus showing numerically as well the readiness of the crystal growth. In addition, the reaction rate equation determined by fitting with the theoretical curve was closer to that of a one-dimensional interface rate-determined model, suggesting crystal growth with orientation in a certain direction.

The data obtained from the above mentioned thermal analysis are provided in Table 5 below.

The activation energies shown in Table 5 were determined by measuring the amount of heat released from the specimen during heating of the specimen, and using the results for calculation by an analytical method known as the Ozawa method.

TABLE 5

| Degree of crystallization | Activation energy (eV) Nickel added | Activation energy (eV) No nickel added |
| --- | --- | --- |
| 10% | 2.04 | 2.69 |
| 30% | 1.87 | 2.90 |
| 50% | 1.82 | 3.06 |
| 70% | 1.81 | 3.21 |
| 90% | 1.83 | 3.34 |
| Average | 1.87 | 3.04 |

The activation energies in Table 5 above are the parameters which indicate the readiness of crystallization, and larger values indicate more difficult crystallization, whereas smaller values indicate more ready crystallization. Judging from Table 5, the nickel-added specimens have a lower activation energy as crystallization progresses. That is, as crystallization progresses, it more readily occurs. On the other hand, it is shown that in the case of the crystalline silicon films prepared according to the prior art with no addition of nickel, the activation energy rises as crystallization progresses. This indicates that crystallization becomes more difficult as it progresses. Furthermore, when the average values of the activation energies are compared, the value for the silicon film crystallized by addition of nickel is about 62% of that of the crystalline silicon film prepared with no addition of nickel, which fact also suggests the readiness of crystallization of a nickel-added amorphous silicon film.

The following describes the results of observing the crystalline shape of the film to which a trace amount of nickel was added, where 800 Å amorphous silicon was used as the starting film, using a TEM (transmission electron microscope). A characteristic phenomenon clear from the results of the TEM observation is that the crystal growth in the nickel-added region differs from that in the surrounding sections. That is, a sectional view of the nickel-added region reveals that a moire or grating image-like stripe is present roughly perpendicular to the substrate, and this leads to the conclusion that the added nickel or its compound formed with silicon functions as the crystallization nucleus, and that the crystals grow roughly perpendicular to the substrate in the same manner as a film with no nickel added. Further, in the regions around that in which nickel was added, there was observed a state in which needle-like or columnar crystal growth occurred in a direction parallel to the substrate.

A more detailed explanation of these phenomena will be given using the following symbols which are basic to the field of crystallography. First, {hkl} is used to indicate all of the planes equivalent to the (hkl) plane. Likewise, <hkl> is used to indicate all of the axes equivalent to the [hkl] axis.

Figure 17:
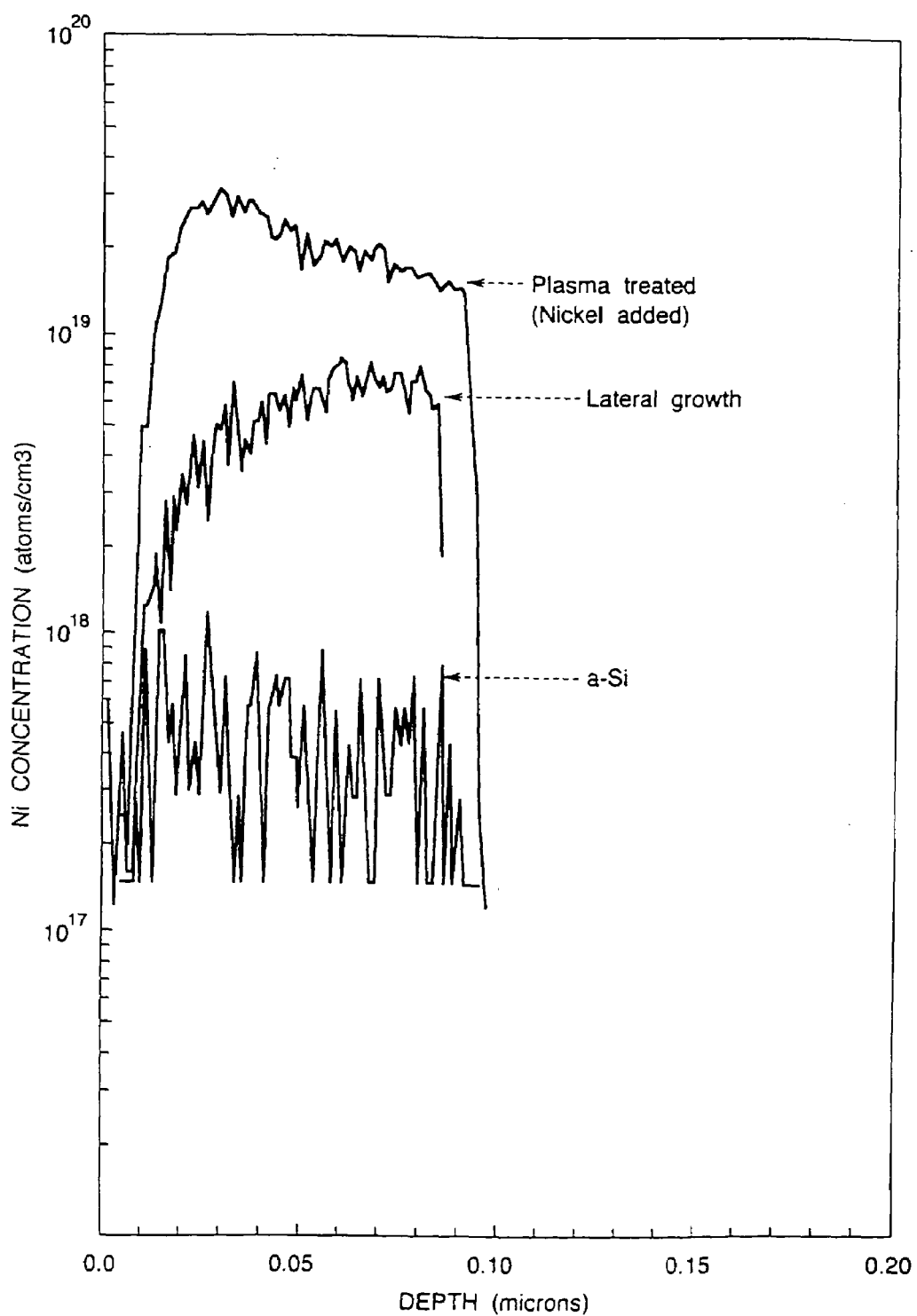
FIG. 17 shows the concentration of nickel in a silicon film.

The results of morphological observation of the crystals around the nickel-added region will be discussed below. First, the fact that crystallization occurred in regions in which a trace of nickel had not been directly introduced was unexpected, but when the nickel concentration in the trace nickel-added section, the section of lateral crystal growth around it (hereunder referred to as "lateral growth section") and the distant amorphous sections (low temperature crystallization did not occur in the very distant sections) was determined by SIMS (secondary ionic mass spectrometry), as shown in FIG. 17, a lower concentration was detected in the lateral growth sections than in the trace nickel-added section, and the amorphous sections showed an amount of about one order less. In other words, it is thought that the nickel had diffused over a rather wide area, and that the crystallization in the regions around the nickel-added region was also an effect of the trace addition of nickel.

Figure 13:
FIG. 13 is a photograph showing the crystal structure of a silicon film.

First, a surface TEM image of the area around the region of nickel addition with amorphous silicon 800 Å thick is shown in FIG. 13. This figure clearly shows characteristic needle-like or columnar crystallization of uniform width in a direction generally parallel to the substrate. Also, a layer with a different contrast than the other portions of the crystal may be seen at the front section of the crystal, and from the results of subsequent high resolution TEM and TEM-EDX this section was found to be $NiSi_2$, revealing the presence of a $NiSi_2$ layer perpendicular to the direction of the crystal growth. (This varies depending on the film thickness, a fact that will be explained later).

Figure 14:
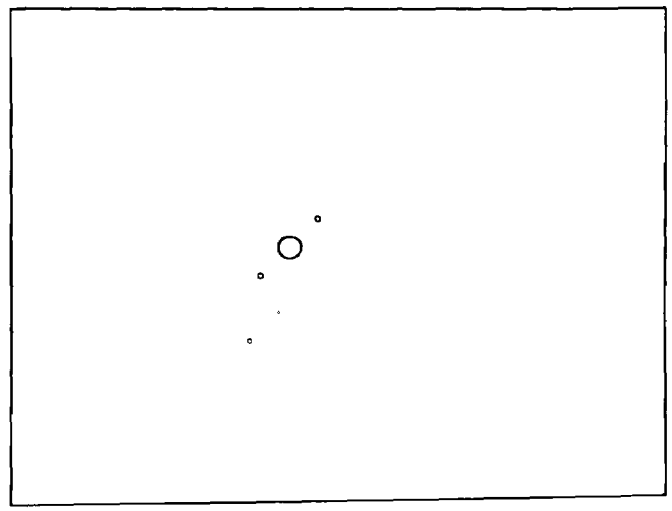
FIG. 14 is a photograph showing the crystal structure of a silicon film.
Figure 14:
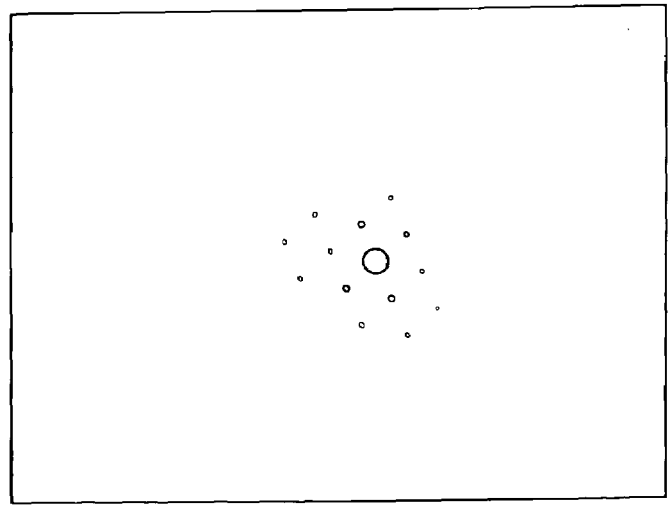
Figure 14:
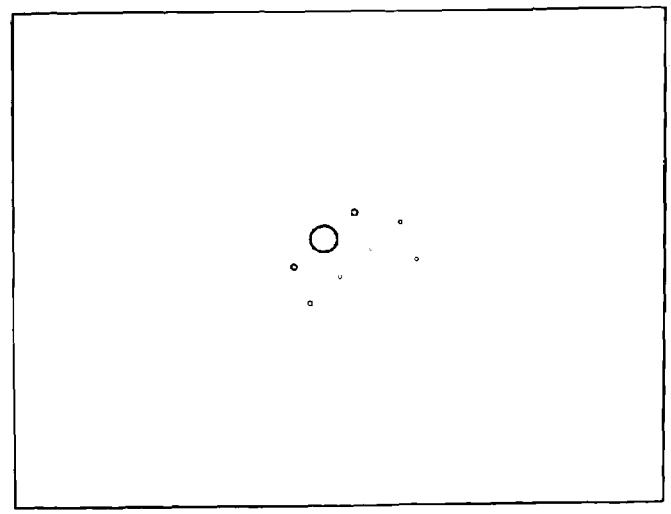
Figure 16:
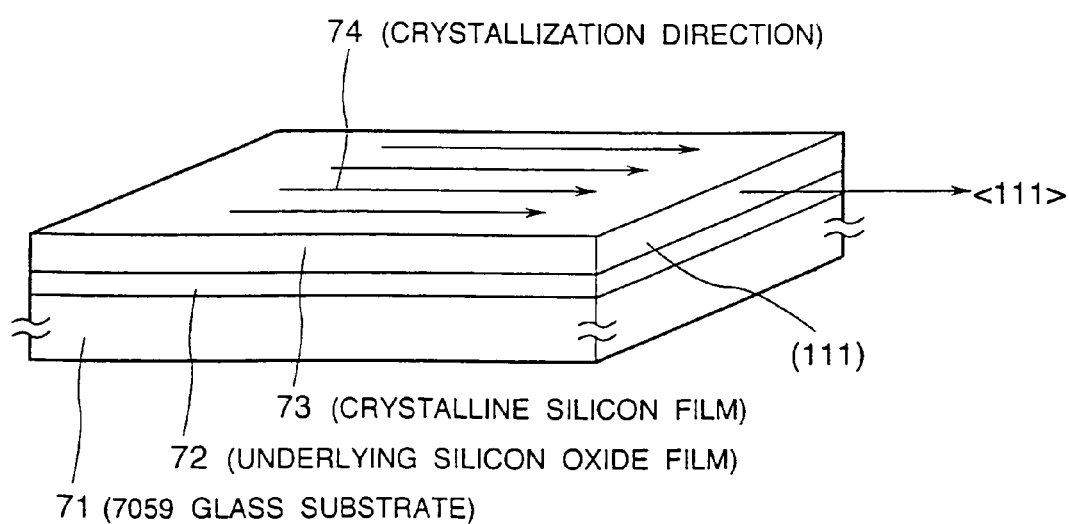
FIG. 16 is an illustrative drawing showing crystal orientation of a silicon film.

Lateral growth generally parallel to the substrate was observed as far as a few hundred μm from the region of trace addition of nickel, and it was also found that the degree of growth also increased in proportion to increases in the time and temperature. As an example, with 4 hours of crystal growth at 550° C., about 20 μm of growth was observed. Next, FIG. 14 shows a TED pattern (electron beam diffraction image) for 3 points in the above mentioned region of needle-like or columnar crystal growth. This TED pattern was taken from a direction perpendicular to the substrate. The pattern shows the crystalline structure of the silicon film. A look at this pattern clearly shows that it is very simple, such that it appears to be composed of single crystals or at most paired crystals, and the orientation of the crystals is very extremely uniform. From this pattern it is clear that the axial direction of the crystal resulting from lateral growth using the above mentioned 800 Å thick amorphous silicon film as the starting film, was the <111> direction. This relationship is shown in FIG. 16.

Based on the above experimental facts, the present inventors are of the opinion that the crystallization is promoted by the following mechanism.

First, considering the vertical growth, generation of nuclei occurs at the initial stage of crystallization, and the activation energy at this time is lowered because of the trace of nickel. This is self-evident from the fact that the addition of the nickel causes crystallization to occur at a lower temperature, and the reason therefor is thought to be, in addition to the effect of the nickel as foreign matter, the fact that one of the intermetallic compounds ($NiSi_2$) composed of nickel and silicon which are produced at a temperature lower than that of crystallization of the amorphous silicon acts as a nucleus for crystallization because its lattice constant is close to that of crystalline silicon. Furthermore, this generation of nuclei occurs almost simultaneously over the entire surface of the region of nickel addition, and thus the mechanism of the crystal growth is such that the growth occurs as a plane, and in such a case the reaction rate equation reflects a one-dimensional interface rate-determining step, with crystals obtained having grown in a direction generally perpendicular to the substrate. However, the crystalline axes are not completely uniform as a result of limitations on the film thickness, stress, etc.

Nevertheless, since the horizontal direction with respect to the substrate is more homogeneous than the perpendicular direction, the needle-like or columnar crystals grow uniformly in a lateral direction with the nickel-added section as the nucleus, and the direction of the plane of growth is <111>; for example, if an amorphous silicon film 800 Å thick is used, the crystal growth is likewise the <111> direction. Obviously, in this case as well the reaction rate equation is presumed to be of a one-dimensional interface rate-determining type. As described earlier, because the activation energy for the crystal growth is lowered by the addition of nickel, the rate of the lateral growth is expected to be very high, and in fact it was.

An explanation will now be given regarding the electrical properties of the above sections of trace addition of nickel and of the surrounding lateral growth sections. Regarding the electrical properties of the region of trace addition of nickel, the conductivity was about the same value as for a film with no nickel added, or a film heated for a few dozen hours at about 600° C. Also, when the activation energy was determined based on the temperature dependence of the conductivity, no behavior seemingly attributable to the level of nickel was observed if the amount of nickel was about $10^{17}$ atoms/cm$^3$ to $10^{18}$ atoms/cm$^3$ as mentioned above. In other words, the experimental facts lead to the supposition that within the above range of concentration, the film may be used as the active layer of a TFT, etc.

In contrast, the lateral growth sections had a conductivity which was one order or more higher in comparison with the region of trace addition of nickel, and this is a high value for silicon semiconductors with crystallinity. This was thought to be due to the fact that, since the path direction of the current matched the direction of lateral growth of the crystals, in the sections between the electrodes through which electrons pass the grain boundary was either few or virtually non-existent, and thus there was no contradiction with the results shown in the transmission electron micrographs. That is, it is conceivable that because the migration of the carrier occurred along the grain boundary of the needle-like- or columnar-growing crystals, a condition for easy migration of the carrier had been created.

Figure 15:
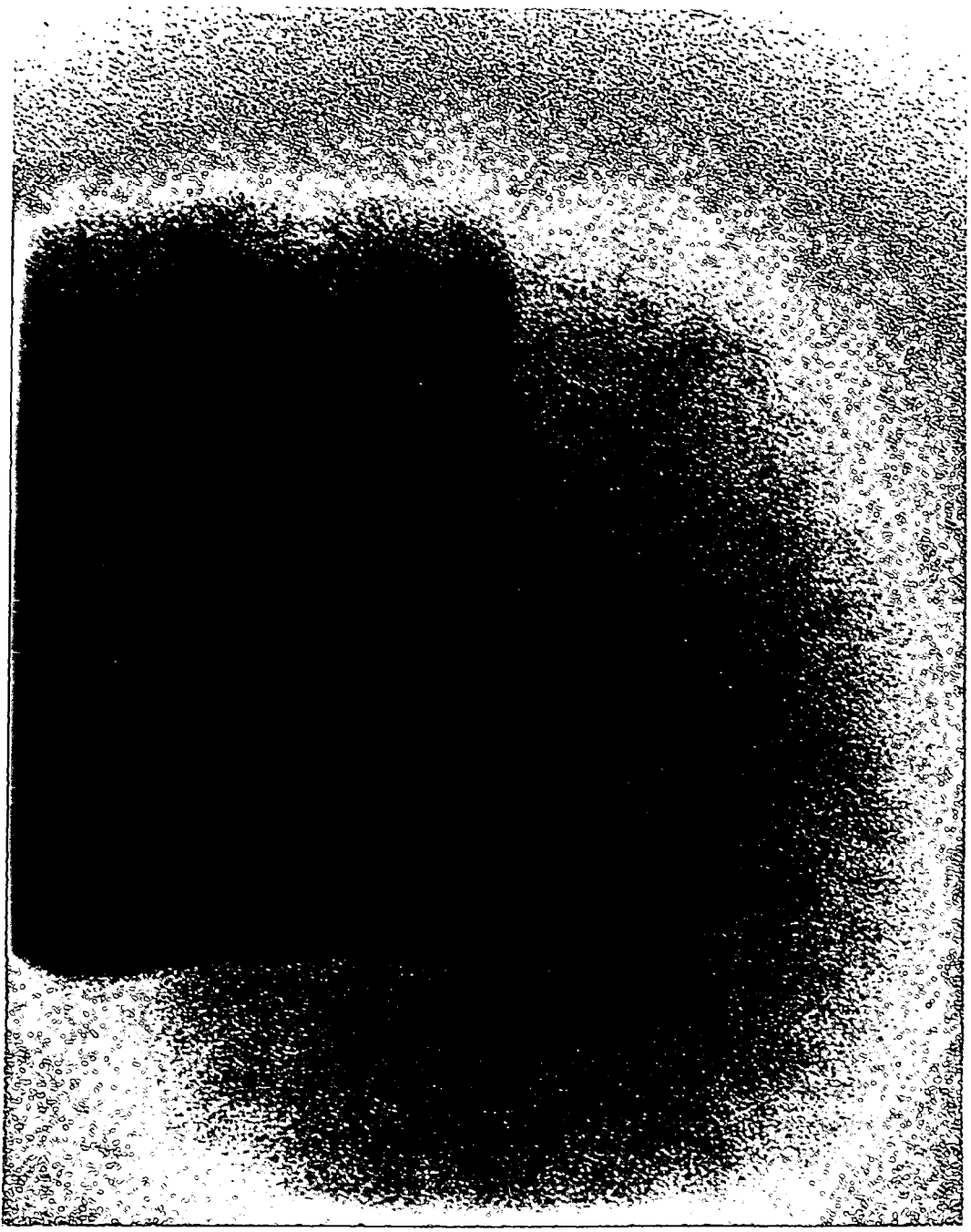
FIG. 15 is a photograph showing the crystal structure of a silicon film.

FIG. 15 is a TEM photograph showing the crystalline structure of the silicon, with an enlarged view of the front section of the needle-like or columnar crystal growth shown in FIG. 13 referred to above. In FIG. 15, a black section may be seen at the front, and this section is clearly NiSi$_2$, as mentioned above. That is, nickel is concentrated at the front of crystallization in which needle-like or columnar crystal growth occurred parallel to the substrate, and it is understood that the nickel concentration in the intermediate regions is low.

Here, as one of the effects of the present invention there may be mentioned the fact that the degree of mobility of the carrier is increased by roughly matching the direction generally along the crystal grain boundary with the direction of migration of the carrier in the semiconductor device (for example, a TFT). Furthermore, by avoiding the front of the regions in which crystal growth occurs in a direction parallel to the substrate, and instead using the intermediate regions, i.e. the regions between the front of growth of the crystalline silicon film occurring in a lateral direction and the region of nickel addition, the crystalline silicon film with easy migration of the carrier as well as low nickel concentration is employed.

The direction along the crystal grain boundary is the direction of needle-like or columnar crystal growth, and with a film thickness of 800 Å (more correctly, the same has been found for greater film thicknesses as well) this direction of growth is the direction in which the crystallinity is in the direction of the <111> axis, and further, as mentioned previously this direction is also the direction which has a selectively high conductivity with respect to the other directions (for example, the direction perpendicular to the crystal growth). Also, an actual problem is that it is difficult to completely match the direction of crystal growth with the direction of flow of the carrier, and the crystals also fail to grow over the entire surface in a uniform direction. Accordingly, in practice the direction of crystal growth is determined on an average of directions. Also, that direction and the direction of flow of the carrier are considered to match if they are within about ±20° of each other, and when an amorphous silicon film 800 Å thick is used, it has been found to be clearly well within this range.

An explanation will now be provided regarding a method of controlling the particle size and the orientation. The specimens in which catalytic elements were introduced for crystallization were subjected to X-ray diffraction, and the following items were investigated as the parameters.

Comparison between introduction of a catalytic element onto the surface of the amorphous silicon film and introduction thereof at its interface with the underlying film.

Comparison between the region of catalyst addition (referred to in the present specification as "vertical growth") and the surrounding regions of lateral growth.

Dependence on variation in the thickness of the amorphous silicon film.

Dependence on variation in the catalyst concentration.

In cases where the lateral growth process is employed, comparison for selection between a structure in which the above region of lateral growth is sandwiched at the top and bottom by silicon oxide and a structure with no silicon oxide on the top surface.

Further, to quantitatively evaluate the tendency observed when the above mentioned parameters were varied, the (111) orientation ratio was defined as shown in Equation 1 below, and the standard for a high (111) orientation was defined as a (111) orientation ratio of 0.67 or over. (For totally random powder, based on the above definition, the (111) orientation ratio is 0.33, and if the ratio is twice of this ratio or higher, no problem is seen in referring to it as (111) orientation.)

Rate of (111) orientation=1 (constant)

Rate of (220) orientation=[relative strength of (220) to (111) for specimen]/[relative strength of (220) to (111) for powder]

Rate of (311) orientation=[relative strength of (311) to (111) for specimen]/[relative strength of (311) to (111) for powder]

(111) Orientation ratio=[Rate of (111) orientation]/ [Rate of (111) orientation+Rate of (220) orientation+Rate of (311) orientation]   Equation 1

From the results of (111) orientation ratio, results shown in Tables 1 to 4 and FIG. 1 are obtained.

TABLE 1

| Location of catalyst addition | Orientation | Particle size |
|---|---|---|
| Silicon surface | Relatively random | Uniform |
| Interface with substrate | Strongly (111) | Uniform |

TABLE 2

| Method of growth | Orientation | Particle size |
|---|---|---|
| Vertical growth | Relatively random | Uniform |
| Lateral growth | Strongly (111) | Uniform |

TABLE 3

| Thin ← Film thickness → Thick |
|---|
| Strong ← (111) orientation → Weak |

TABLE 4

| Presence of top surface oxide film | Orientation |
|---|---|
| Present | Generally (111) |
| Absent | Variation due to film thickness |

The methods of preparation were all the same except for the parameters listed in the tables, while nickel was used as the catalytic element, the manner of addition of the nickel was from a solvent (hereunder referred to as the liquid phase method), and in cases where there is no indication for lateral growth, vertical growth was employed by application of the solution on the silicon surface. However, for the experiment of comparing the performance with the presence or absence of a silicon oxide film on the surface in the lateral growth process, in order to effect a lateral growth process with no silicon oxide on the top surface there was used a nickel-added solution for SOG, such as OCD or the like, and unlike the other lateral growth processes, the OCD was left only in the region of direct addition (region of vertical growth) to create a structure wherein no silicon oxide was present on the region for lateral growth. Furthermore, the solid phase growth (also indicated by SPC in the drawings) was induced by heating at 550° C. for 8 hours, and was followed by laser crystallization (the crystallinity may be dramatically increased by this complementary treatment) at 300 mJ/cm$^2$.

The results of changing the location of addition of the catalyst are given in Table 1, which shows the specific tendency for totally different orientation even with only a change in the location of addition. Virtually no dependence on the location of addition was found for the particle size, and when the particle sizes were measured at arbitrary locations, the width of distribution was found to be about half that of the cases in which no catalytic element was added, and therefore a uniform particle size had clearly been obtained.

Table 2 gives the results of changing the method of crystal growth, and it shows a comparison between a case where nickel was introduced throughout the entire surface (vertical growth) and a case in which a silicon oxide film was formed on the amorphous silicon (silicon oxide cover), the silicon oxide was patterned to make openings for the catalytic element, and lateral growth was induced from those openings. As a result, the vertical growth section was relatively random, whereas almost all of the lateral growth sections covered with the silicon oxide film had a (111) orientation, although it depended on the film thickness. (The dependence on film thickness is described later).

Figure 9:
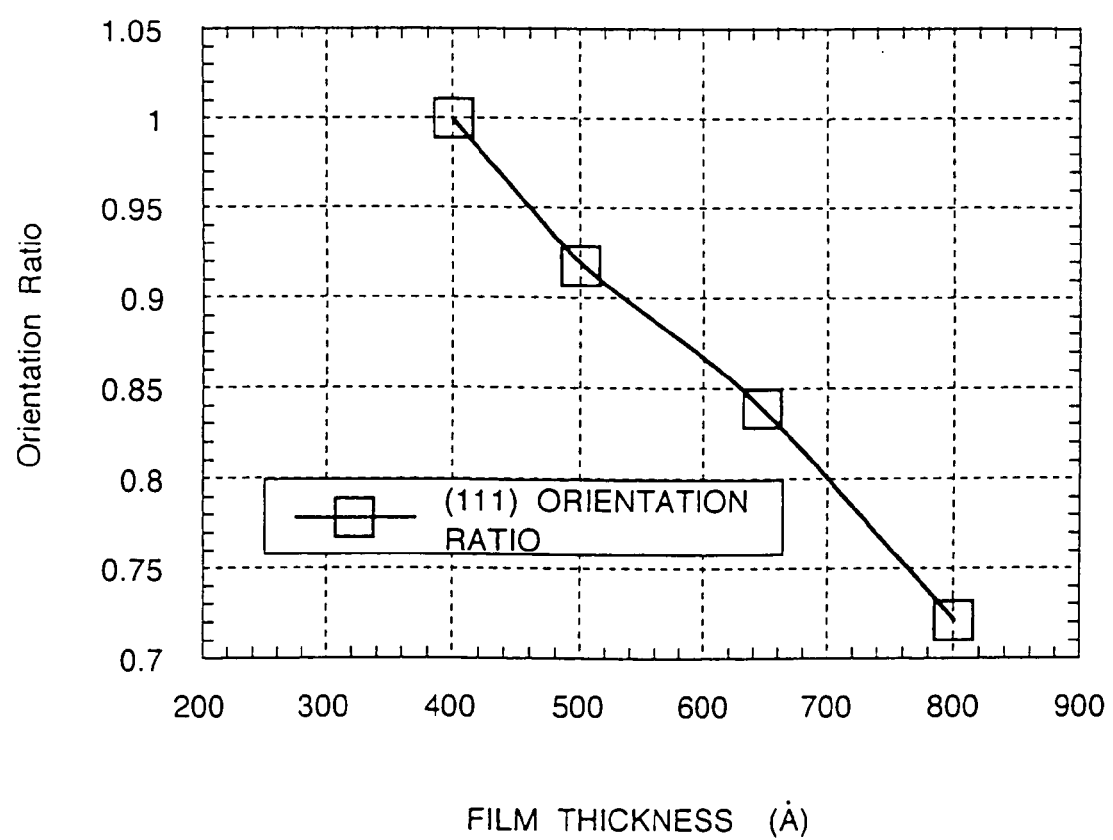
FIG. 9 shows the relationship between film thickness and orientation of a crystalline silicon film.

Table 3 shows the dependence on film thickness, and when experimentation was conducted for film thicknesses of 300 Å to 5000 Å, in the lateral growth sections there was observed a clear tendency toward a stronger (111) orientation for smaller film thicknesses. A linearity was discovered in the range of 400 Å to 800 Å roughly within the margin of error, as shown in FIG. 9. Since the vertical growth section was random from the start, no obvious tendency was found.

Table 4 shows the results of comparison of the effect of the presence or absence of a surface silicon oxide film on the lateral growth process, and as mentioned previously, in the case of the specimens which underwent the lateral growth process with no silicon oxide on the top surface, though the orientation changed depending on the film thickness none of the orientation was (111) orientation, as mentioned above, whereas the orientation of the crystalline silicon obtained by the lateral growth process with silicon oxide on the surface was strongly (111) orientation, and particularly, as FIG. 9 strongly suggests, at 800 Å or less there was a rather strong (111) orientation. From this it is concluded that the (111) orientation may be reinforced by making the film thickness 800 Å or less.

FIG. 1 shows a plot of the dependence of lateral growth on changes in the nickel dose, with the horizontal axis showing the dose for liquid-phase addition using nickel acetate or nitrate, the left vertical axis showing (111) orientation ratio and the right vertical axis showing the proportion of the region of the silicon film crystallized by solid-phase growth before laser crystallization. From this graph it is clear that it is possible to freely change the (111) orientation ratio from random to (111) orientation by varying the concentration of the catalytic element. Furthermore, it is understood that these completely match the proportion changes in cases where solid-phase growth occurred prior to laser crystallization, and this was confirmed by observing the same tendency in other cases in which the proportion of solid-phase growth which occurred prior to laser crystallization was varied by changing the heating temperature and heating time instead of the concentration.

Regarding the particle size, which is not shown in the drawings, observation of the particle size using an optical microscope (At present, it is not clear whether the object is monocrystalline.) confirmed a reduction from 33 μm to 20 μm accompanying the dose increase.

Regarding the mechanism of the above experimental results, as far as the orientations are concerned all of the effects may be explained as the degree of influence of the silicon/silicon oxide interface during solid growth. From this point of view, the explanation of the above phenomenon is as follows.

Regarding the results in Table 1, when a catalytic element is introduced at the interface with the substrate the orientation is already influenced by the substrate at the time of nucleus generation, and at this point the probability of (111) orientation is high. In comparison, when nuclei are generated at the top surface, random generation of nuclei may be effected without any influence of the substrate. Thus, it is believed that these factors control the crystal growth throughout.

Regarding the results in Table 2, the vertical growth section has the same mechanism as described above, and as regards the lateral growth, since the growth points grow while in contact with the substrate and the silicon oxide cover, they are believed to be much more susceptible to the influence thereof.

Regarding the film thickness dependency in Table 3, it is thought that if the film thickness is increased, the proportion of the energy at the interface with the underlying silicon oxide with respect to the total free energy is relatively lowered, and thus the (111)-orienting force is weakened.

Figure 18:
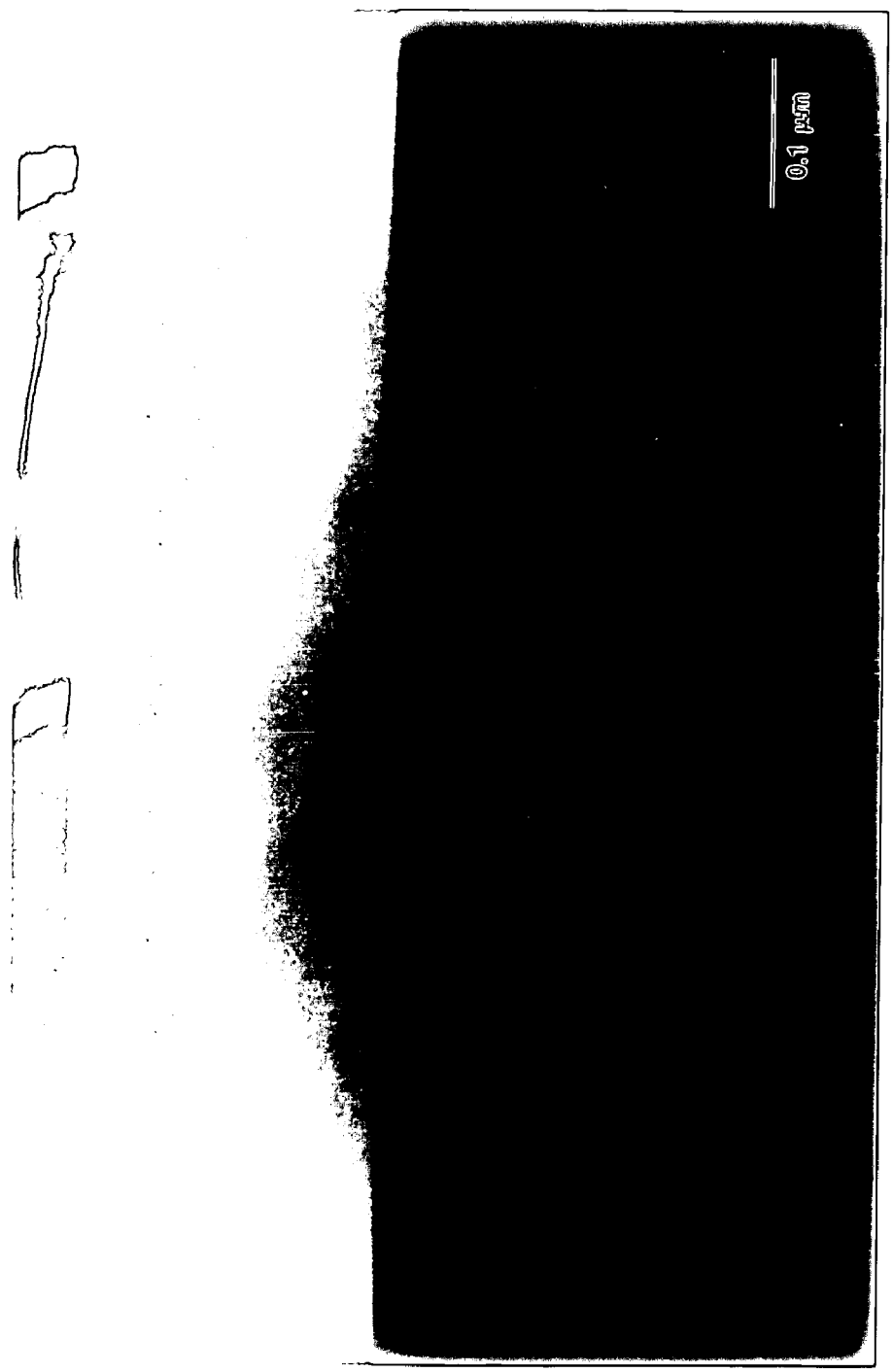
FIG. 18 is a sectional photograph of the front section of a silicon film.
Figure 19A:
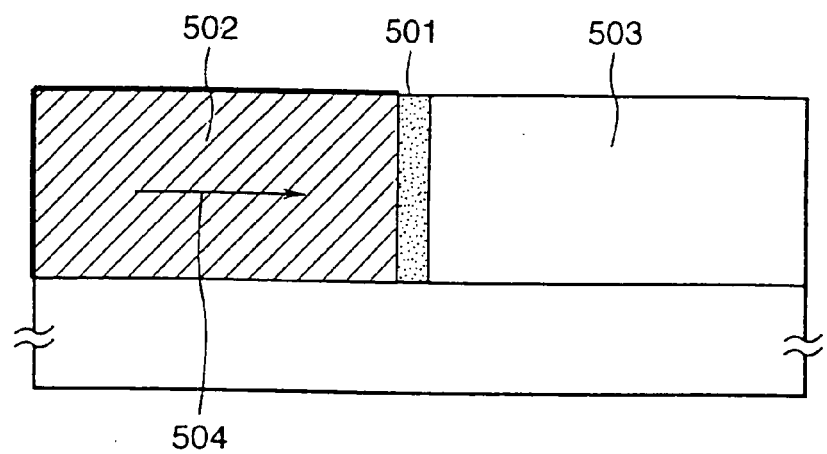
FIGS. 19A–B are an illustrative drawing showing the mechanism of crystallization of a silicon film.
Figure 19B:
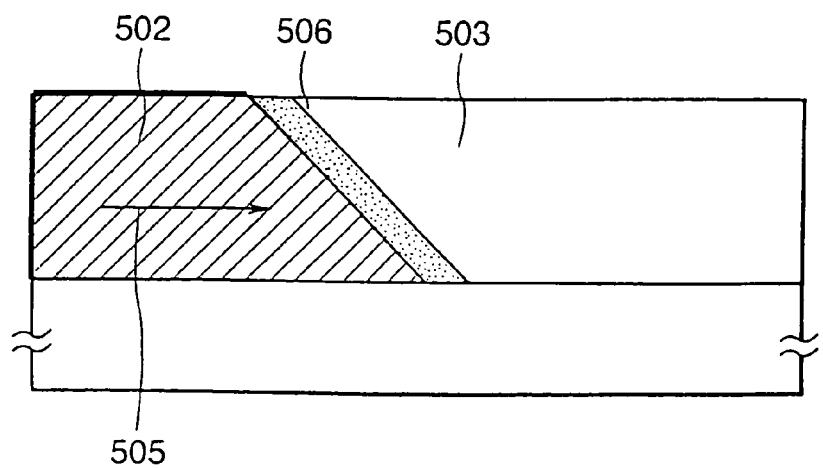

Regarding the results of the two lateral growths (of films with and without a silicon oxide film on the top surface) in Table 4, it is thought that the film with the top surface covered with silicon oxide becomes to be covered with silicon oxide on the top and the bottom, and to have the (111) orientation which stabilizes the interfaces. In contrast, it is thought that the lateral growth process which occurs with no silicon oxide on the top surface has the interface contribution lowered to only half as much, thereby weakening the restraint on orientation to the same degree and thus exhibiting orientation other than (111). Incidentally, as mentioned above, in the lateral growth process occurring with no silicon oxide film on the top surface, there was a clear correlation between the film thickness and the orientation. For example, when 500 Å amorphous silicon was used, strong (200) or (311) orientation was observed. In this regard, it may be concluded from a crystallographical analysis and from photographs such as the one shown in FIG. 18 that the crystal growth is occurring by a mechanism similar to the one in FIG. 19. That is, the crystal growth plane 501 or 506 is the (111) plane, and though it is always constant, the angle which this plane makes with the substrate is almost unconditionally defined by the film thickness. Consequently, if the film thickness is changed, for example, with a film thickness of 800 Å, the apparent direction of crystal growth 504 and the crystal growth plane 501 are roughly perpendicular, and the resulting orientation (orientation usually refers to the orientation of the direction perpendicular to the substrate) is observed to be in a direction perpendicular to the axis <111>. However, with a film thickness of 500 Å, the crystal growth plane 506 and the apparent direction of crystal growth 505 are not perpendicular, and consequently the orientation also changes. In other words, in the process of lateral growth with no silicon oxide on the top surface, the orientation may be controlled by varying the film thickness.

Figure 2:
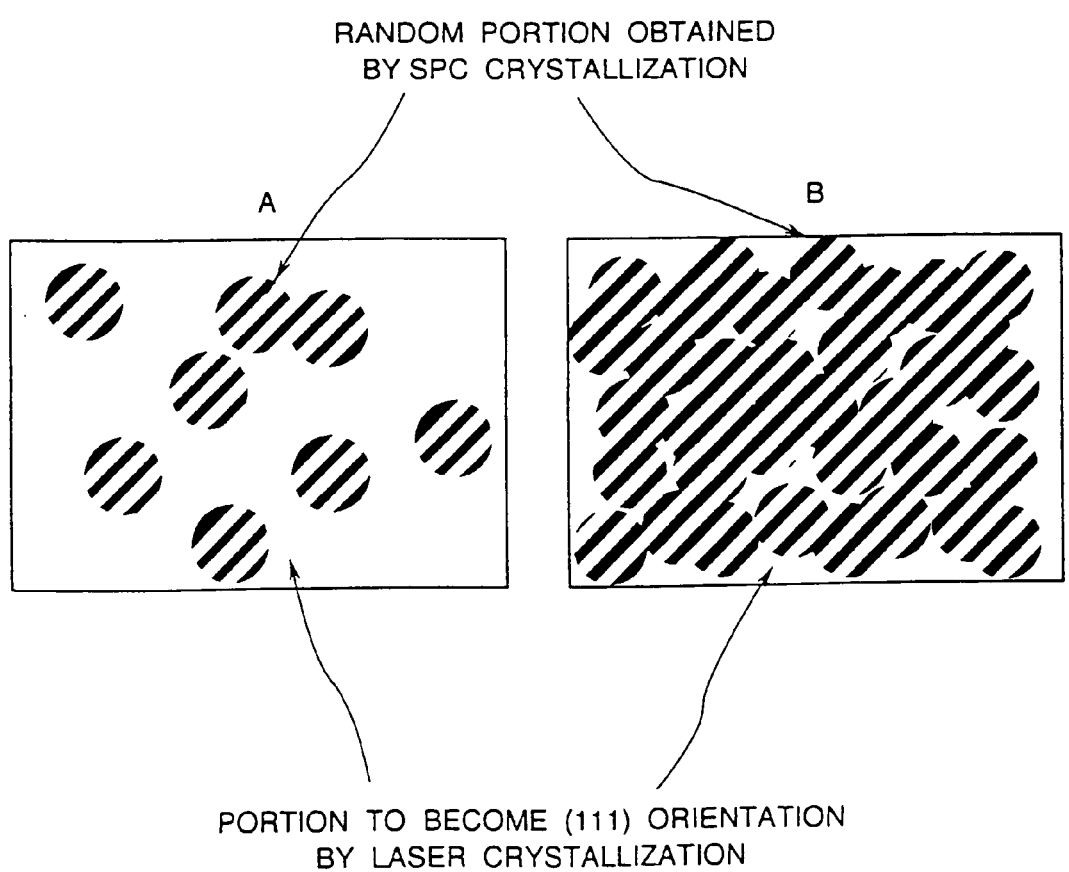
FIG. 2 shows a model for explanation of the crystallization mechanism.

The results shown in FIG. 1 are easily explained by recognizing that the above mentioned vertical growth proceeds at random, and the laser crystallization exhibits (111) orientation. FIG. 2 shows a simplified version of the mechanism therefor. In this figure, A is an example wherein the dose of the catalytic element is small, there are few random sections in which crystallization by solid-phase growth occurs before laser crystallization, and there are more sections of (111) orientation due to laser crystallization; B is an example wherein almost all of the growth is solid-phase growth, and hence there are almost no sections of (111) orientation due to laser crystallization. To support the above, an experiment was attempted in which the energy density and irradiation time were varied during laser crystallization. It was thereby shown that as the energy density and irradiation time were increased, the (111) orientation ratio became higher. This result suggests a direct connection between raising the proportion of laser crystallization and the (111) orientation ratio.

As concerns the particle size, the above phenomenon may be on an assumption that the nucleus generation density is unconditionally determined by the dose of the catalytic element, not by the location, etc. of the catalytic element, which in turn determines the size to which the crystal growth may occur.

In summary, the method of controlling the low temperature crystallization and the orientation are as follows.

First, using the method of adding a catalytic element, represented by nickel, at the surface by the liquid phase method, the crystallization is effected as a combination of solid-phase growth and laser crystallization. Thus, by addition of a trace amount of a catalytic element, it becomes possible to lower the crystallization temperature and dramatically reduce the time required.

For a Film with a High (111) Orientation

The lateral growth process is employed or the crystallization ratio before laser crystallization is lowered. By using this method it is possible to adjust the (111) orientation ratio as desired within 0.67 to 1. The method selected for lowering the crystallization ratio may be a method of reducing the dose of the catalytic element or varying the conditions of the solid-phase growth.

For a Random Film

Using the vertical growth process, the crystallization ratio before laser crystallization is increased. The method selected for increasing the crystallization ratio may be by raising the dose of the catalytic element or varying the conditions of the solid-phase growth.

For a Film with an Intermediate Orientation

Using the vertical growth process, the crystallization ratio before laser crystallization is suitably adjusted. By using this process it is possible to adjust the (111) orientation ratio as desired within 0.33 to 1. The method selected for adjusting the crystallization ratio to a suitable value may be by varying the dose of the catalytic element or varying the conditions of the solid-phase growth.

For a Film with Other Orientations

Using the lateral growth process on a film with no silicon oxide on the top surface, the film thickness is changed to control the orientation. Here, from the viewpoint of controllability the film thickness is preferably varied within a range of about 800 Å to 300 Å. With thicknesses above this range, the width of the columnar crystals was less than the film thickness and there was a greater tendency toward randomness, while with thicknesses less than 300 Å crystal growth was difficult.

The method of varying the particle size of the crystals may be the following.

For a larger particle size, the concentration of the added catalytic element is lowered.

For a smaller particle size, the concentration of the added catalytic element is raised.

While controlling the dose of the above mentioned catalytic element, it is effective to control temperature and time of the solid-phase growth. However, the maximum degree to which the particle size may be increased is unconditionally determined by the dose of the above mentioned catalytic element.

According to the present invention, the most notable effect is achieved when nickel is used as the catalytic element, but other species of catalytic elements which may be used include Pt, Cu, Ag, Au, In, Sn, Pd, Pb, As and Sb. In addition, one or more elements selected from the group consisting of Group VIII, IIIb, IVb and Vb elements may also be used.

Furthermore, the method of introducing the catalytic element is not limited to the liquid-phase method using a solution such as an aqueous solution, one in alcohol or the like, as a wide range of substances containing catalytic elements may be used. For example, metallic compounds and oxides which contain a catalytic element may be used.

Finally, an explanation will be given regarding methods of applying the various properties mentioned above to a TFT. Here, the field of application of the TFT is assumed to be an active matrix-type liquid crystal display which uses the TFT as a driver for a picture element.

As described above, it is important to minimize the shrinkage of the glass substrates in recent large-screen active matrix-type liquid crystal displays, and by using the process of adding a trace amount of nickel according to the present invention, the crystallization is possible at a sufficiently low temperature compared to the warping point of glass, and thus it is a particularly suitable method. By following the present invention, the section using the conventional amorphous silicon may easily be replaced by crystalline silicon by adding a trace amount of nickel thereto and conducting the crystallization at about 500 to 550° C. for about 4 hours. Obviously, some variations will be required to adapt to specific rules of design, etc., but the present invention may be carried out satisfactorily with the devices and the processes of the prior art, and thus its advantages are thought to be considerable.

EXAMPLES

Example 1

This example illustrates the preparation of a silicon film with a high (111) orientation which involves selective provision of a 1200 Å silicon oxide film which is used as a mask for selective introduction of nickel and lateral growth.

Figure 3A:
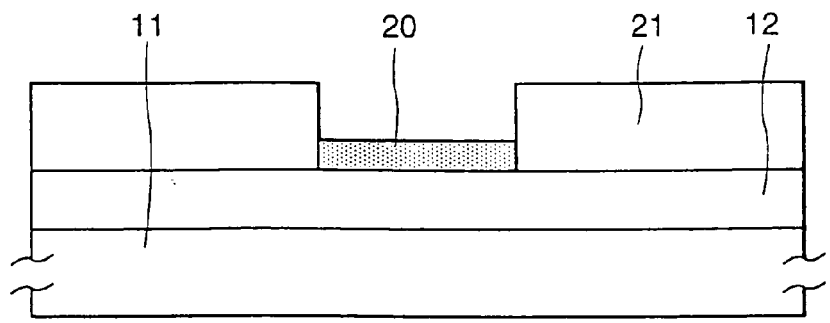
FIGS. 3A–C show the steps of preparation in an example.
Figure 3B:
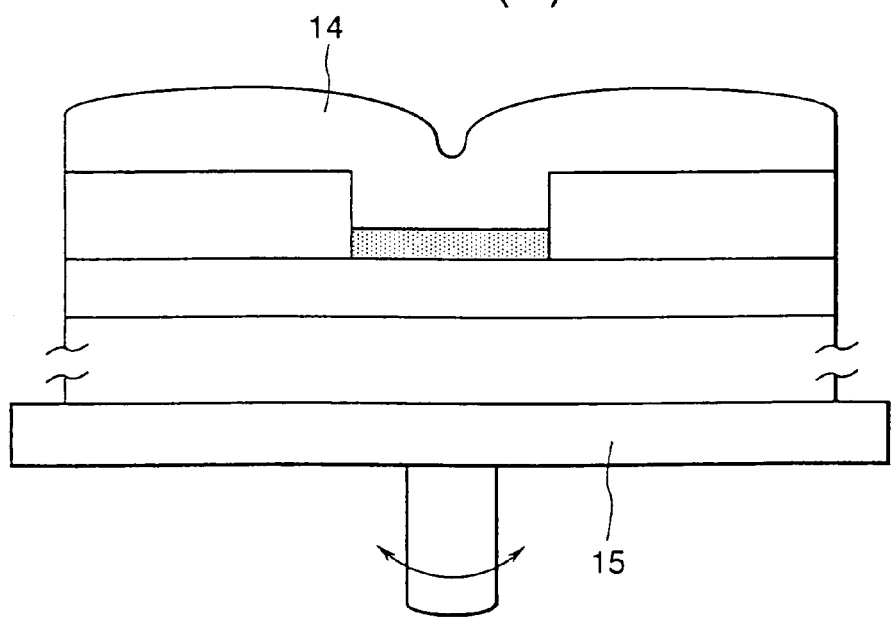
Figure 3C:
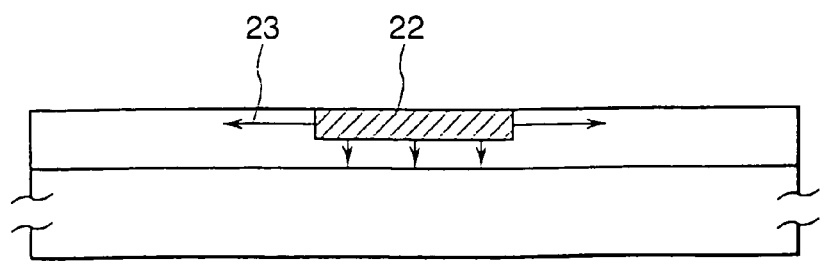

The preparation process in this example is outlined in FIG. 3. First, on an amorphous silicon film (a 500 Å film prepared by plasma CVD) placed on a glass substrate (Corning 7059, 10 cm square) there is formed a silicon oxide film 21 which functions as a mask (silicon dioxide cover) to a thickness of 1000 Å or more, 1200 Å in this example. The inventors have experimentally confirmed that a thickness of the silicon dioxide film 21 exceeding 500 Å does not cause any particular trouble, and it is believed that thinner films may be accepted as long as they have fine quality.

The silicon oxide film 21 is then patterned as desired by a conventional photolithographical patterning process. Thereafter irradiation with ultraviolet ray is conducted in an oxygen atmosphere for the formation of a thin silicon oxide film 20. The preparation of this silicon oxide film 20 is effected by irradiation with UV rays for 5 minutes in an oxygen atmosphere. Here an appropriate thickness of the silicon oxide film 20 is believed to be around 20–50 Å (FIG. 3(A)). Relating to the provision of this silicon oxide film for improvement of the wettability, it may be effected appropriately due to the hydrophilic properties of the masking silicon oxide film alone in the case where the solution and the pattern have a matching size. This case is, however, exceptional, and in most cases the use of the silicon oxide film 20 is recommended for security.

To the substrate in this state there is added dropwise 5 ml of an acetate solution which contains 100 ppm of nickel. At the same time spin coating is carried out for 10 seconds with a spinner at 50 rpm to form a uniform aqueous film 14 on the entire surface of the substrate. After this state is maintained for an additional one minute, spin drying is conducted for 60 seconds with a spinner at 2,000 rpm. It may be rotated at 0 to 100 rpm on the spinner during that lapse (the additional one minute)(see FIG. 3(B)).

Then heat treatment is effected for 8 hours at 550° (in a nitrogen atmosphere) for the crystallization of the amorphous silicon film 12. Here the crystal grows in a lateral direction from the region comprising the nickel-introduced section 22 to regions with no nickel introduced, as indicated by 23. The degree of the lateral growth under the preset conditions was about 30 μm. Thereafter the silicon oxide cover was peeled off with buffer hydrofluoric acid, followed by laser crystallization with a KrF excimer laser (248 nm) at a power density of 300 mJ/cm$^2$.

Figure 4:
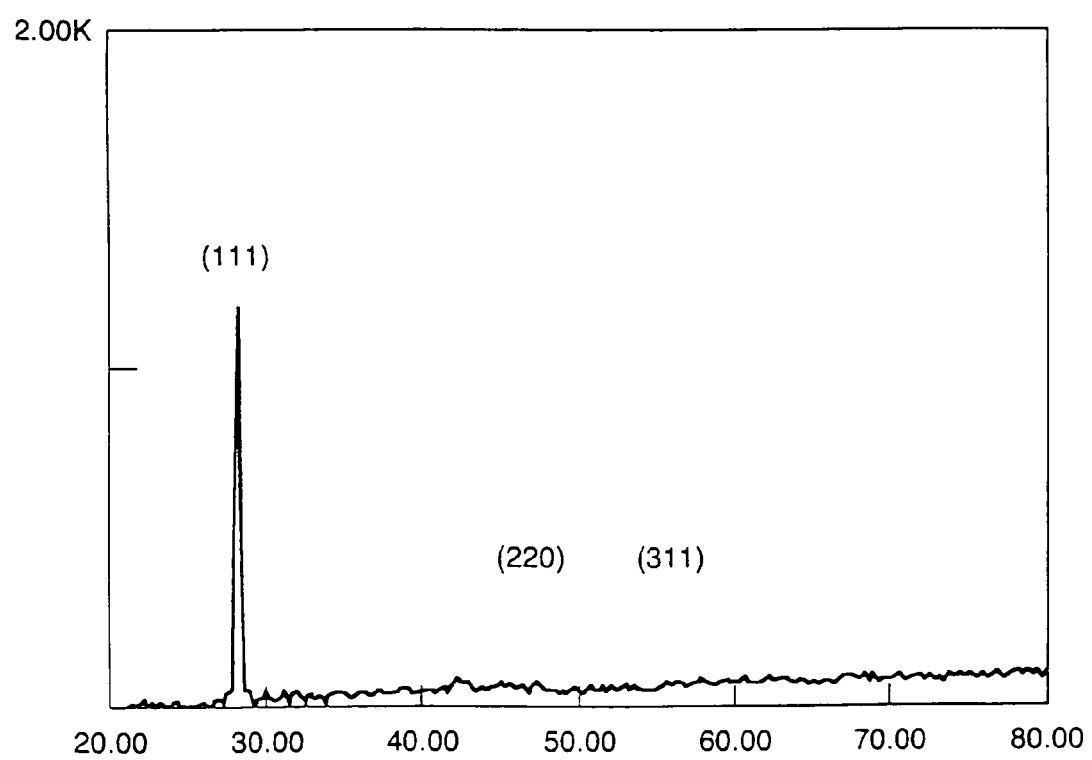
FIG. 4 shows the results of X-ray diffraction of a crystalline silicon film.
Figure 5A:
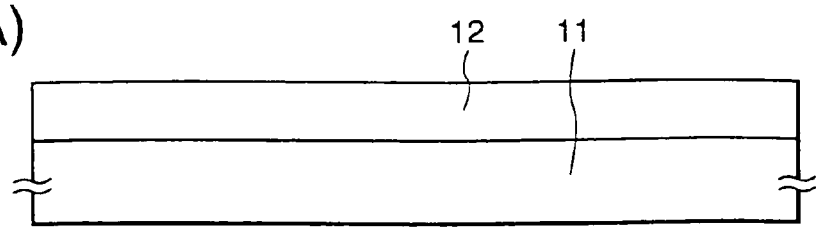
FIGS. 5A–D show the steps of preparation in an example.
Figure 5B:
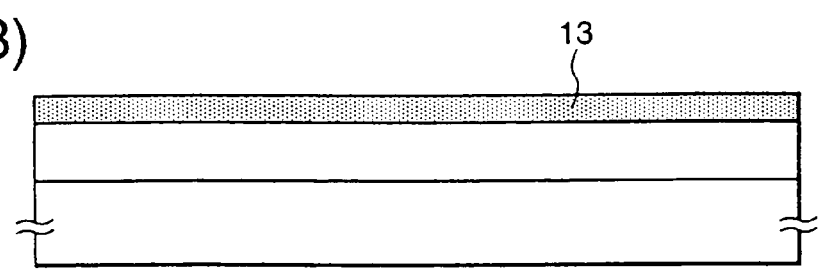
Figure 5C:
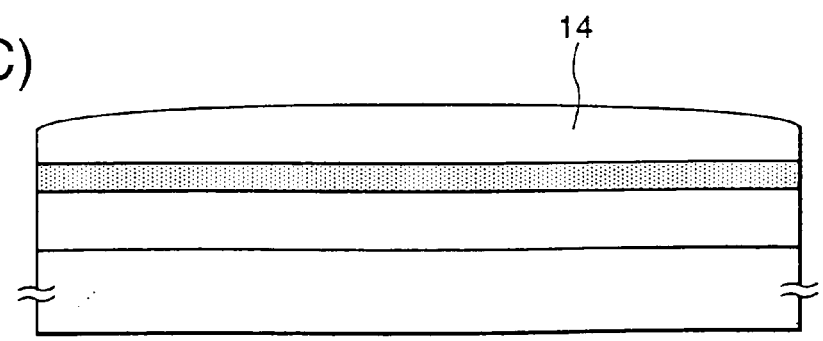
Figure 5D:
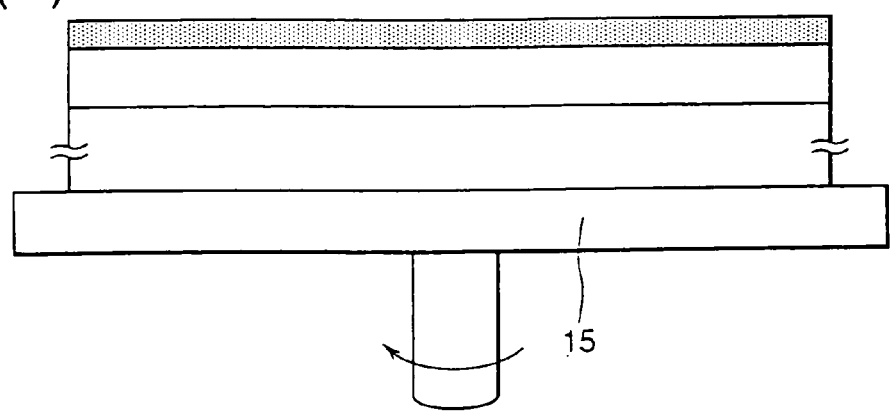

The thus prepared silicon film was subjected to X-ray diffraction and found to have a very high level of (111) orientation, with a (111) orientation ratio of 0.917. The results are shown in FIG. 4.

Example 2

This Example is for a case where entirely the same process as in Example 1 was used, varying only the thickness of the amorphous silicon film to two levels, 400 Å and 800 Å.

The results revealed that the (111) orientation ratio obtained with X-ray diffraction for the 400 Å specimen was about 1.0, showing it to be an almost completely (111)-oriented film, while that of the 800 Å specimen was 0.720, or somewhat less (111) orientation as compared with the 500 Å sample.

Example 3

This example is for a case where a crystallization-facilitating catalytic element is contained in an aqueous solution which is then applied on an amorphous film, which is then subjected to heat for crystallization followed by irradiation with laser light for further improvement of the crystallinity. This case corresponds to the vertical growth in the previous description, and may provide a film with a relatively random orientation.

The process as far as the introduction of a catalytic element (in this case, nickel was used) will be explained with reference to FIG. 5. In this example, Corning 7059 glass is employed as the substrate 11. Its size is 100 mm×100 mm.

First, the amorphous silicon film 12 is formed to 100 to 1500 Å by plasma CVD or LPCVD. In this particular case, the amorphous silicon film 12 is formed to a thickness of 500 Å by plasma CVD (FIG. 5(A)).

Then, to remove the dirt and spontaneous oxide film, treatment with hydrofluoric acid is carried out, after which an oxide film 13 of 10–50 Å is formed. The spontaneous oxide film may be employed directly instead of the oxide film 13 if the dirt is negligible.

The oxide film 13 is extremely thin and thus the exact thickness of the film is impossible to measure; nevertheless, it is believed to be roughly 20 Å. In this example, the oxide film 13 is formed by irradiation with UV light in an oxygen atmosphere. The film-forming condition was UV irradiation for 5 minutes in an oxygen atmosphere. Thermal oxidation may be used as the process for the formation of the oxide film 13. Treatment with hydrogen peroxide may be effected as well.

The oxide film 13 is intended to facilitate the spreading of the acetate solution over the whole surface of the amorphous silicon film; that is, for the improvement of the wettability, during the later step of applying the acetate solution which contains nickel. For example, if the acetate solution is applied directly on the surface of the amorphous silicon film, then the amorphous silicon film repels the acetate solution, and thus nickel cannot be introduced on the entire surface of the amorphous silicon film. In other words, uniform crystallization is impossible to accomplish.

Next there is prepared an aqueous acetate solution which contains nickel. The concentration of nickel is adjusted to 25 ppm. A 2 ml portion of the resulting solution of an acetate is then added dropwise to the surface of the oxide film 13 on the amorphous silicon film 12 for the formation of an aqueous film 14. This state is maintained for 5 minutes. Then a spinner is employed to conduct spin drying (2,000 rpm, 60 seconds) (FIG. 5(C), (D)).

The actual nickel concentration may be as low as 1 ppm or more, but the level was set to 25 ppm in this example in view of the desired orientation. The use of a solution in a non-polar solvent, e.g. nickel 2-ethyl-hexanoic acid in toluene as the solution makes it unnecessary to use the oxide film 13, allowing for direct introduction of a catalytic element on the amorphous silicon film.

The step of applying the nickel solution may be repeated one to several times to result in the formation of a nickel-containing layer which has an average thickness of several to several hundred Å on the surface of the spin-dried amorphous silicon film 12. With this construction, the nickel in the layer diffuses into the amorphous silicon film and acts as a catalyst to facilitate the crystallization during the subsequent heating step. Here the layer is not always a complete film. Only one application was conducted in this example.

After application of the solution mentioned above, the state is maintained for one minute. The final concentration of the nickel contained in the silicon film 12 may also be controlled by adjusting the lapse time, but the most significant control factor is the concentration in the solution.

Heat treatment in a furnace is then conducted at 550° C. for 8 hours in a nitrogen atmosphere. As a result there may be provided a partially crystallized silicon film 12 formed on the substrate 11. The crystallization ratio at this stage was determined to be 98.84% by computer-aided image analysis.

The above heat treatment may be carried out at a temperature of 450° or more, although the lower the temperature, the longer the heating time, which leads to a lower production efficiency. At 550° C. or more care must be taken not to cause trouble due to the level of heat resistance of the glass substrate used as the substrate.

In this example there is illustrated a method whereby a catalytic element is introduced on the amorphous silicon film, but another method may be employed as well which introduces a catalytic element beneath the amorphous silicon film. According to the latter method, however, it is noted that an extremely high level of (111) orientation is attained, as described above.

To the partially crystallized silicon film 12 obtained by the heat treatment, there are given several shots of KrF excimer laser light (wavelength: 248 nm, pulse width: 30 nsec.) at a power density of 200 to 350 $mJ/cm^2$, in this particular example, one shot at 300 $mJ/cm^2$, in a nitrogen atmosphere for complete crystallization of the silicon film 12. This process may be carried out by irradiation with IR light, as mentioned above.

Figure 6:
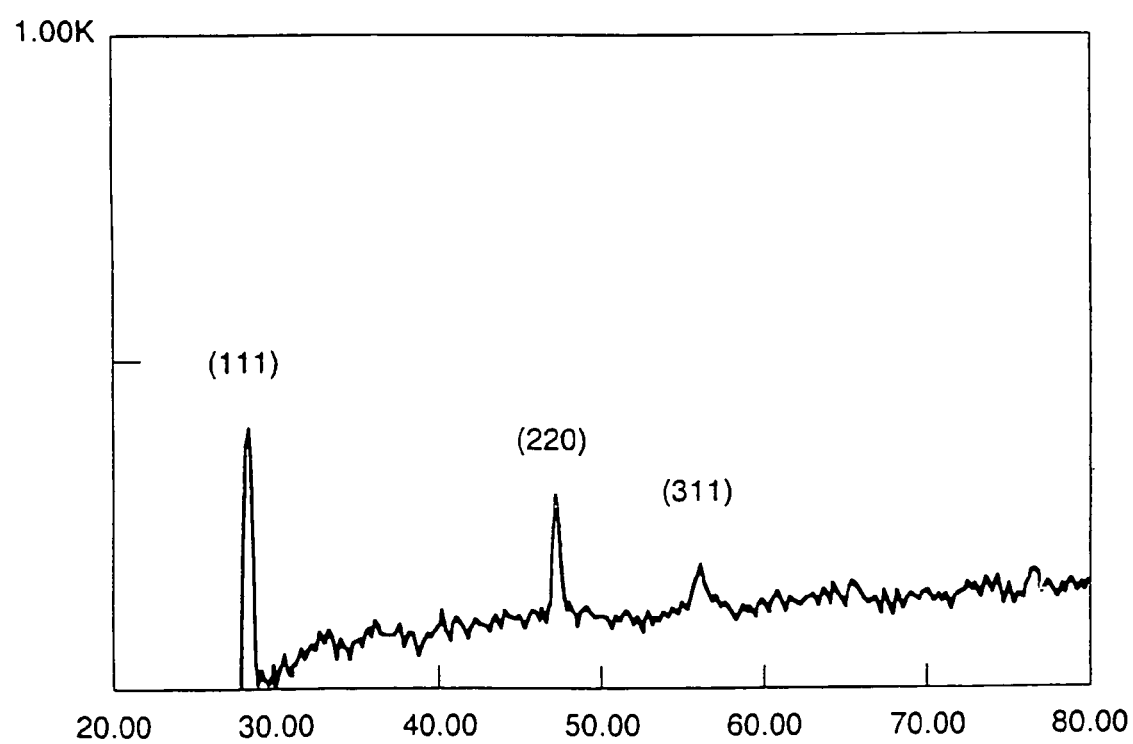
FIG. 6 shows the results of X-ray diffraction of a crystalline silicon film.

The orientation of the thus prepared crystalline silicon film was measured by X-ray diffraction. The results are shown in FIG. 6. The peaks of (111), (220) and (311) were clearly observed, and the (111) orientation ratio was calculated to be 0.405 based on this observation, proving that a desired random oriented film had been obtained.

Example 4

This example is a modification of Example 3 wherein the concentration of the salt of nickel, a catalytic element, has been changed into 1 ppm. The other conditions are the same as in Example 3. This construction enables the particle size of each crystal to be enlarged. In this example experiments were conducted under two solid growth time conditions of 4 and 16 hours.

Microscopic observation of the film after the heat treatment revealed that the sample with the lowered concentration of the nickel salt and subjected to solid growth for 4 hours had a greater proportion of amorphous silicon and fewer numbers of crystal nuclei comprising crystalline silicon. Next the laser-crystallized specimen was subjected to secco etching, followed by observation with SEM. As a result, it has been found that with the lower concentration in the solution as in the present example the size of the respective crystal grains may be enlarged as compared with the case of Example 2.

In addition, by subjecting the laser-crystallized specimen to X-ray diffraction, there was formed a (111)-oriented film with a (111) orientation ratio of 0.730, from the specimen which had undergone solid growth for 4 hours. On the other hand, the orientation ratio of the specimen obtained by solid phase growth for 16 hours was as low as about 0.4, and the film was random.

Example 5

This example is for a case where the crystalline silicon film prepared by using the method of the present invention was employed to provide a TFT. The TFT of this example may be used as part of the driver circuit or picture element of an active matrix type liquid crystal display. In this connection, it need not be mentioned that the range of application of the TFT embraces not only liquid crystal displays, but also so-called thin-film integrated circuits. The process for the preparation according to this example is outlined in FIG. 7. First an underlying silicon dioxide film (not shown) is formed on the glass substrate 11 to a thickness of 2000 Å. This silicon oxide film is provided to prevent the diffusion of impurities from the glass substrate.

Then a 500 Å-thick film of amorphous silicon is formed in the same manner as in Example 1. Thereafter treatment with hydrofluoric acid was conducted to remove the spontaneous oxide film, after which a thin oxide film was formed to a thickness of about 20 Å by irradiation with UV light in an oxygen atmosphere. This process for preparing the thin oxide film may be replaced by treatment with hydrogen peroxide or thermal oxidation.

A solution of an acetate which contained 25 ppm of nickel was applied on the film which was then allowed to stand for 1 minute, after which it was subjected to spin drying with a spinner. Thereafter the silicon dioxide films 20 and 21 (FIG. 3(A)) were removed with buffer hydrofluoric acid, followed by heating at 550° C. for 8 hours for the crystallization of the silicon film. (The foregoing procedures are the same as in the preparation process shown in Example 1).

The above heat treatment provides a silicon film comprising amorphous and crystalline components in admixture. The crystalline components make up regions wherein crystal nuclei are present. Further 200–300 $mJ/cm^2$, in this particular example 300 $mJ/cm^2$, of KrF excimer laser light was irradiated to improve the crystallinity of the silicon film. During this process for irradiation with the laser the substrate is heated to about 400° C. This process is helpful to further improve the crystallization.

Then the crystallized silicon film was patterned to form a island region 104. This island region 104 constitutes an active layer of the TFT. Thereafter a thin silicon oxide film 105 of thickness 200 to 1500 Å, specifically 1000 Å in this example, was formed. This silicon oxide film also functions as a gate-insulating film (FIG. 7(A)).

Care should be taken during the preparation of the above silicon oxide film 105. Here, the starting material TEOS was decomposed and deposited together with oxygen by RF plasma CVD at a substrate temperature of 150 to 600° C., preferably 300 to 450° C. The pressure ratio of TEOS to oxygen was set 1:1 to 1:3, while the pressure and the RF power was set to 0.05 to 0.5 torr and 100 to 250 W, respectively. Alternatively, TEOS was used as the starting material which underwent low pressure or atmospheric CVD at a substrate temperature of 350 to 600° C., preferably 400 to 550° C., with ozone for the formation of the film. The formed film was annealed at 400 to 600° C. for 30 to 60 minutes in an oxygen or ozone atmosphere.

The formed film may be subjected directly to irradiation with KrF excimer laser light (wavelength: 248 nm, pulse width: 20 nsec) or any other light of the same power to facilitate the crystallization of the silicon region 104. Particularly, RTA (rapid thermal annealing) with infrared rays selectively heats the silicon without heating the glass substrate, thereby reducing the interface level at the interface between the silicon and the silicon oxide film, and thus is useful to prepare insulated-gate type field-effect semiconductor devices.

Then an aluminum film of thickness 2,000 Å to 1 μm was formed by electron-beam evaporation and patterned to form a gate electrode 106. The aluminum may be doped with 0.15 to 0.2% by weight of scandium (Sc). Next the substrate was dipped in a solution in ethylene glycol containing 1 to 3% tartaric acid at a pH of 7 for anodization using platinum as the cathode and the aluminum gate electrode as the anode. For the anodization, first the voltage was increased to 220 V at a constant current, and this condition is maintained for 1 hour to complete the process. In this example 2 to 5 V/min. was appropriate as the rate of the voltage increase under a condition of constant current. There was thus formed the anodic oxide 109 having a thickness of 1500 to 3,500 Å, e.g. 2,000 Å (FIG. 7(B)).

Thereafter ion doping (or plasma doping) was utilized to implant an impurity (phosphorus) into the island silicon film of each of the TFTs with the gate electrode member as the mask, in a self-aligning manner. The gas used for the doping was phosphine ($PH_3$). The dose is 1 to $4 \times 10^{15}$ $cm^{-2}$.

Figure 7A:
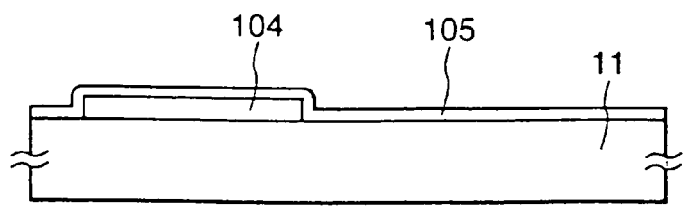
FIGS. 7A–E show the steps of preparation in an example.
Figure 7B:
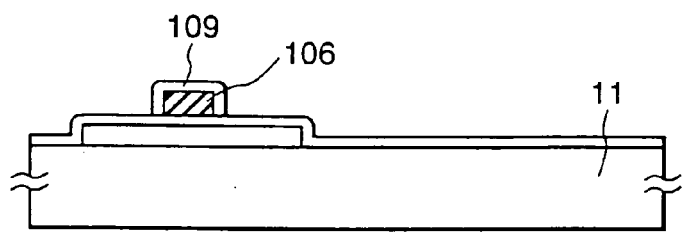
Figure 7C:
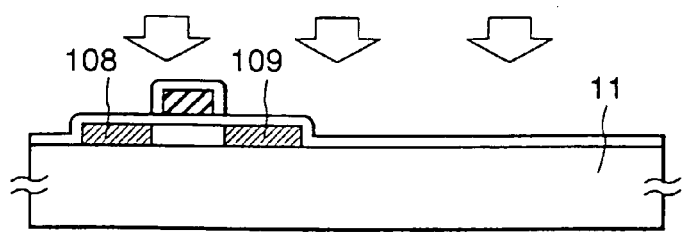
Figure 7D:
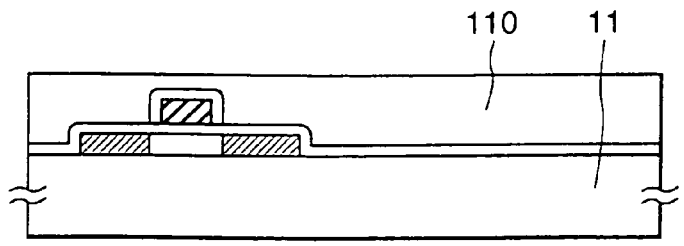

Then, as shown in FIG. 7(C), the film is irradiated with KrF excimer laser light (wavelength: 248 nm, pulse width: 20 nsec.) to improve the crystallinity of portions in which crystallinity had deteriorated due to the introduction of the above impurity. The energy density of the laser light is 150 to 400 mJ/$cm^2$, preferably 200 to 250 mJ/$cm^2$. Thus there are formed N-type impurity regions 108 and 109. The sheet resistance of these regions was 200 to 800 Ω/□.

In this step, the laser light may be replaced by any other type of light which is as powerful as laser light including so-called RTA (rapid thermal annealing) (or RTP: rapid thermal process) whereby a sample is heated to 1000 to 1200° C. (temperature of the silicon monitor) in a short time with a flash lamp.

Then on the entire surface, there is formed a 3,000 Å thick silicon oxide film as the interlayer insulator from TEOS as the starting material by plasma CVD with oxygen or by low pressure CVD or atmospheric CVD with ozone. The substrate temperature is set to 250 to 450° C., for instance 350° C. The formed silicon oxide film is then mechanically polished to provide the surface with evenness (FIG. 7(D)).

Figure 7E:
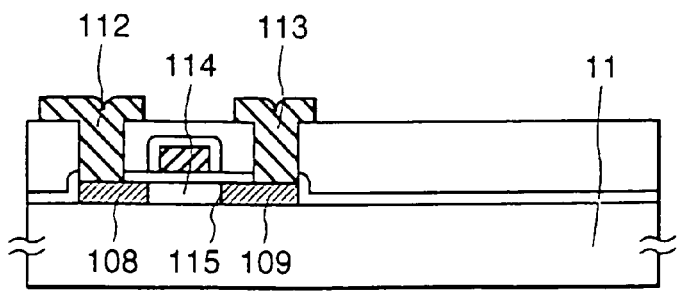

Thereafter, as shown in FIG. 7(E), etching is made in the interlayer insulator 110 to create a contact hole in the source/drain of the TFT and chrome or titanium nitride wirings 112 and 113.

Finally, annealing is conducted in hydrogen at 300 to 400° C. for 1 to 2 hours for the completion of hydrogenation of the silicon. The TFT is thus completed. Many TFTs prepared at the same time are arranged to set up an active matrix-type liquid crystal display. The TFT has source/drain regions 108/109 and a channel-forming region 114. In addition 115 denotes an electrical junction NI.

With the construction according to the present example the concentration of nickel in the active layer is assumed to be about $3 \times 10^{18}$ atoms/$cm^3$ or less, more specifically $1 \times 10^{16}$ atoms/$cm^3$ to $3 \times 10^{18}$ atoms/$cm^3$.

The TFT prepared in this example has a mobility of 75 $cm^2$/Vs or more for N channels. Further it was confirmed to have satisfactory properties with a small $V_{th}$. Additionally the mobility was confirmed to range within ±5%. This lowered variation is believed to be due to the random orientation which does not cause anisotropy of the operating characteristics of the device. Though 100 $cm^2$/Vs or more may easily be established for N-channel types with laser light alone, the variation becomes large and the uniformity observed in this example cannot be established.

Example 6

This example is a modification of the construction in Example 5, wherein the nickel concentration has been changed to 1 ppm, and the crystal particle size has been increased. The rest of the construction is exactly as in Example 5.

This resulted in a degree of mobility for the N channel of 150 $cm^2$/Vs or greater. This is thought to be the effect of the larger crystal particle size. However, there were variations in the mobility of about ±30%, and thus the uniformity was not so high. The reason for this is not clear, but it is presumed to be that since it had some degree of (111) orientation, there was some possibility of the occurrence of anisotropy in the device.

Example 7

In this example, nickel is selectively introduced as shown in Example 2, and an electronic device is formed using the region of crystal growth in a lateral direction (parallel to the substrate) from the section of introduction. When employing such a construction, the nickel concentration in the active layer regions of the device may be further lowered for a very desirable construction from the point of view of electrical stability and reliability of the device. In addition, by giving the amorphous silicon film a film thickness of 400 Å it is possible to obtain a film with almost total (111) orientation.

FIG. 8 shows the steps of preparation for this example. First, a substrate 201 is washed, and an underlying film of silicon oxide is formed to a thickness of 2000 Å by the plasma CVD method using TEOS (tetraethoxysilane) and oxygen as the starting gas. Also, the plasma CVD method is used to form an intrinsic (type I) amorphous silicon film 203 which has a thickness of 300 to 1500 Å, in this example 400 Å. Next, a silicon oxide film 205 is formed by the plasma CVD method in a continuous manner to a thickness of 500 to 2000 Å, e.g. 1000 Å. The silicon oxide film 205 is then selectively etched to form a region of exposed amorphous silicon 206.

A solution (here an acetate solution) containing elemental nickel as the catalytic element to promote crystallization is then applied by the method indicated in Example 2. The nickel concentration in the acetate solution is 100 ppm. The detailed order of steps and the conditions are otherwise the same as indicated in Example 1. This process may also be according to the method given in Example 5 or Example 6.

After this, heat annealing is performed for 8 hours at 500 to 620° C., e.g. 550° C., in a nitrogen atmosphere, and a silicon film 203 is crystallized. The crystallization is promoted starting from the region 206 where the nickel and silicon film are in contact, with the crystal growth in a direction parallel to the substrate, as indicated by the arrow. In the figure, region 204 is the section of crystallization with direct addition of nickel, and region 203 is the section of crystallization in a lateral direction. The lateral crystallization indicated by 203 is about 25 μm (FIG. 8(A)).

After the step of crystallization by the above heat treatment, the crystallinity of the silicon film 203 is further promoted by irradiation with laser light. This step is exactly the same as in Example 1, but in order to perform the laser crystallization without removing the silicon oxide film 205, in this example, the crystallization was carried out at 350 mJ/cm$^2$, an even higher energy than in Example 1.

Figure 8A:
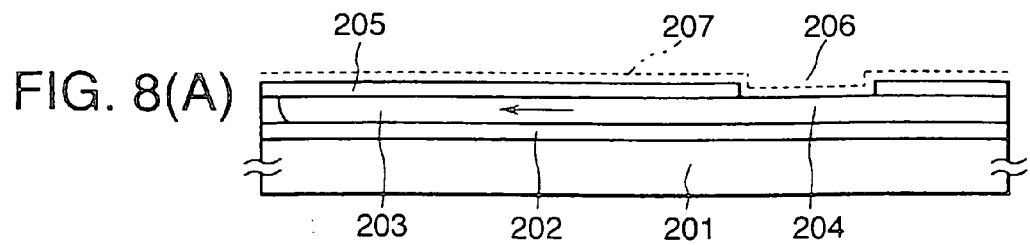
FIGS. 8A–F show the steps of preparation in an example.
Figure 8B:
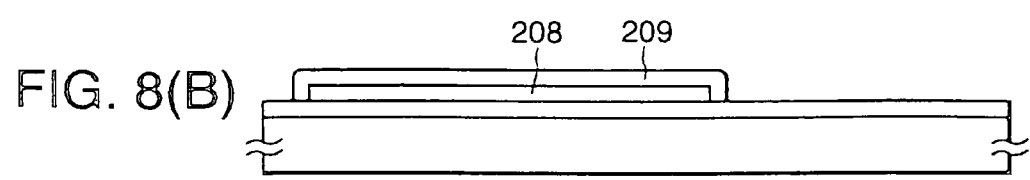
Figure 8C:
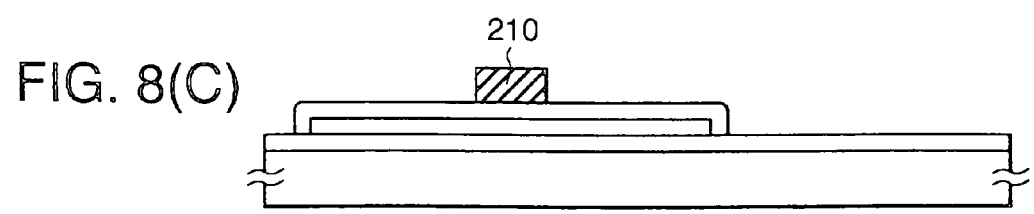
Figure 8D:
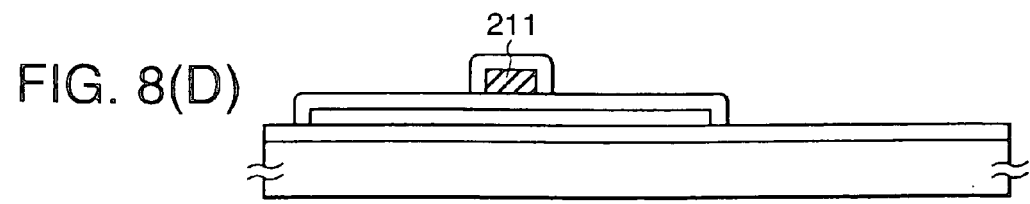
Figure 8E:
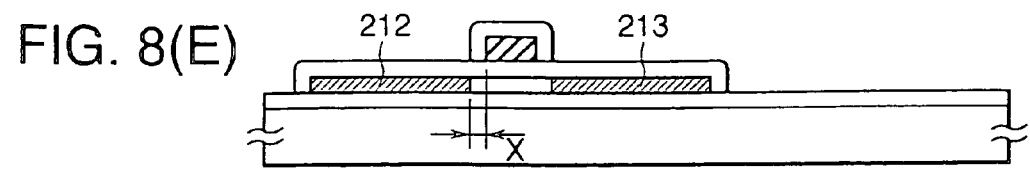
Figure 8F:
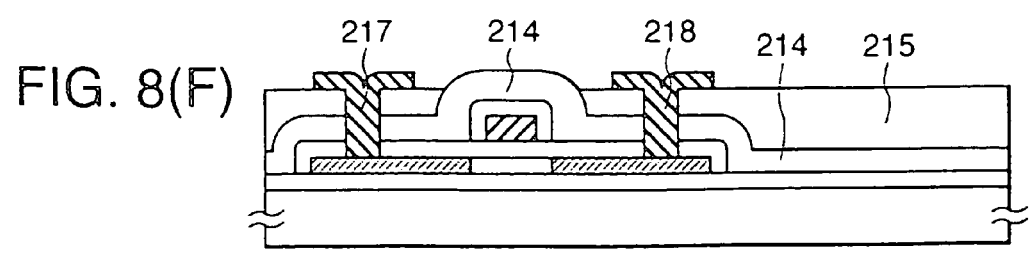

Next, the silicon oxide film 205 is removed. At the same time, the oxide film formed on the surface of the region 206 is also removed. The silicon film is patterned by dry etching to form an island active layer region 208. Here, the region indicated by 206 in FIG. 8(A) is the region into which nickel was directly introduced, and it has a high concentration of nickel. As expected, a high concentration of nickel was also found at the front of the crystal growth. In these regions, the nickel concentration was clearly higher than in the middle regions. Consequently, in this example, these high nickel concentration regions were not allowed to overlap the channel forming regions in the active layer 208.

After this, the surface of the active layer (silicon film) 208 is oxidized by allowing it to stand for one hour in a 100% by volume water vapor-containing atmosphere at 10 atmospheres, and 500 to 600° C., typically 550° C., to form a silicon oxide film 209. The thickness of the silicon oxide film is 1000 Å. After formation of the silicon oxide film 209 by thermal oxidation, the substrate is kept in an ammonia atmosphere (1 atmosphere pressure, 100%) at 400° C. Infrared light with a peak at a wavelength of 0.6 to 4 μm, for example 0.8 to 1.4 μm, is irradiated onto the substrate in this state for 30 to 180 seconds, for nitriding of the silicon oxide film 209. In this situation the atmosphere may be mixed with 0.1 to 10% HCl. (FIG. 8(B))

Next, a film of aluminum (containing 0.01 to 0.2% scandium) is formed by the sputtering method to a thickness of 3000 to 8000 Å, for example 6000 Å. This aluminum film is then patterned to form a gate electrode 210 (FIG. 8(C)).

Then, the surface of this aluminum electrode is subjected to anodization to form an oxide layer 211 on the surface thereof. This anodization is carried out in an ethylene glycol solution containing 1 to 5% tartaric acid. The thickness of the resulting oxide layer 211 is 2000 Å. Since this oxide 211 attains the thickness forming the offset gate region in the following ion doping step, the length of the offset gate region may be determined in the above anodization step (FIG. 8(D)).

Next, the ion doping method (or the plasma doping method) is used to add an impurity (here, phosphorus) which provides N-conductive type in a self-matching manner to the active layer region (comprising the source/drain and channel), using the gate electrode section, i.e. the gate electrode 210 and the oxide layer 211 around it, as a mask. Phosphine ($PH_3$) is used as the doping gas, and the acceleration voltage is 60 to 90 kV, e.g. 80 kV. The dose is $1\times10^{15}$ to $8\times10^{15}$ cm$^{-2}$, e.g. $4\times10^{15}$ cm$^{-2}$. As a result it is possible to form N-type impurity regions 212 and 213. As is also clear from the drawings, there is an offset condition of a distance x between the impurity region and the gate electrode. This offset condition is particularly effective from the viewpoint of reducing the leak current (also called the off-current) when reverse voltage (minus for an N-channel TFT) is applied to the gate electrode. In particular, a TFT according to this example in which the picture element of an active matrix is controlled preferably has a low leak current so that the charge accumulated in the picture element electrode does not escape, for a more satisfactory image, and therefore providing the offset is effective.

Annealing is then performed by irradiation of laser light. The laser light used is from a KrF excimer laser (wavelength: 248 nm, pulse width: 20 nsec), but other lasers may be used. The conditions of the laser light irradiation are an energy density of 200 to 400 mJ/cm$^2$, for example 250 mJ/cm$^2$, and irradiation with 2 to 10 shots, for example 2 shots per location. A greater effect is achieved by heating the substrate to about 200 to 450° C. at the time of laser irradiation (FIG. 8(E)).

Next, a silicon oxide film 214 of thickness 6000 Å is formed by the plasma CVD method as an interlayer insulator. Also, the spin coating method is used to form a transparent polyimide film 215, to flatten the surface.

Also, contact holes are formed in the interlayer insulators 214, 215, and TFT electrodes/wiring 217, 218 are formed by a multi-layer film of metal materials, such as titanium nitride and aluminum. Finally, annealing is performed in a hydrogen atmosphere at one atmosphere pressure, at 350° C. for 30 minutes, thus completing the picture element circuit of the active matrix with a TFT (FIG. 8(F)).

The TFT prepared in this example has a high degree of mobility, and thus it may be used in the driver circuit of an active matrix-type liquid crystal display. Specifically, a mobility of 250 cm$^2$/Vs or greater was achieved in the N-channel. It is presumed that this high mobility is attributed to reduction of the potential barrier of the grain boundary which is attributed to the very high degree of orientation of crystal.

Example 8

This example is a case in which the lateral growth method in Example 7 was changed to a method employing OCD. That is, the silicon oxide film 205 of thickness 500 to 2000 Å, e.g. 1000 Å which was continuously formed subsequent to the formation of the 500 Å intrinsic (type I) amorphous silicon film 203 was omitted, and instead a nickel-added SOG film, in this case an OCD Type-2 non-doped material Si-59000-SG, product of Tokyo Ohka Kogyo Co., Ltd. was used to form a substance containing a nickel compound. Before this film was formed, the surface was exposed to ozone to form a very thin oxide film, and then the OCD was formed.

Prebaking at 80° C. and 150° C. was then effected, followed by curing at 250° C. If this curing temperature is too high special attention will be necessary since nickel will already disperse in the amorphous silicon during this step. Furthermore, the very thin oxide film produced by the ozone acts as a barrier against dispersion in the curing step, and if it is absent special attention will be necessary since the nickel will disperse even at 250° C.

Next, a prescribed patterning is effected. For this patterning, the mask in Example 7 was used and positive-negative inversion was performed with a resist. Regarding the etching after patterning, a dry rather than wet process is preferred because the etching rate of OCD is extremely fast.

The following steps are the same as in Example 7 and thus the description thereof is omitted. The characteristics of the resulting TFT were almost the same as the one in Example 7.

When the gate section of the TFT was peeled off to determine the orientation of the active layer section below it by electron diffraction, it was found that almost the entirety thereof had a (200) orientation.

Example 9

This Example is an case of forming a complementary integrated circuit including a P-channel type TFT (called a PTFT) and a N-channel type TFT (called an NTFT) each made using a crystalline silicon film on a glass substrate. The construction of this Example may be used in a switching element for a picture element electrode and a peripheral driver circuit of an active-type liquid crystal display, or an image sensor or other integrated circuit.

A sectional view showing the steps of preparation for this example is given in FIG. 10. First, an underlying film 302 of silicon oxide is formed on a substrate (Corning 7059) 301 to a thickness of 2000 Å by the sputtering method. Next, a mask 303 is provided which is a metal mask, or a silicon oxide film or the like. This mask 303 provides a slit-shaped exposure of the underlying film 302 at the region indicated by 300. That is, when FIG. 10(A) is viewed from the top, the underlying film 302 is exposed with a slit shape, while the other sections thereof are masked.

After the above mask 303 is provided, a nickel silicide film (chemical formula: $NiSi_x$, where $0.4 \leq x \leq 2.5$, e.g., x=2.0) is selectively formed on the region 300 by the sputtering method to a thickness of 5 to 200 Å, for example, 20 Å.

Next, an intrinsic (type 1) amorphous silicon film 304 of thickness 500 to 1500 Å, for example 1000 Å, is formed by the plasma CVD method. This is then crystallized by annealing for 4 hours in a hydrogen reduction atmosphere (preferably at a hydrogen partial pressure of 0.1 to 1 atmospheres) at 550° C. or in an inert atmosphere (at atmospheric pressure) at 550° C. Here, in the region 300 on which the nickel silicide film is selectively formed, crystallization of the crystalline silicon film 304 occurs vertically with respect to the substrate 301. Also, in the regions other than the region 300, as shown by the arrow 305, crystal growth occurs in a lateral direction from the region 300 (parallel to the substrate).

As a result of the above mentioned steps, it is possible to obtain a crystalline silicon film by crystallization of an amorphous silicon film 304. Next, a silicon oxide film 306 is formed by the sputtering method to a thickness of 1000 Å as a gate insulation film. In the sputtering, silicon oxide is used as the target and the temperature of the substrate during the sputtering is 200 to 400° C., for example 350° C., the atmosphere for sputtering consists of oxygen and argon, and the argon/oxygen ratio is 0 to 0.5, for example 0.1 or less. The elements are then separated to ensure an active layer region for the TFT. Here, it is important that no front of crystal growth such as indicated by 305 be present in the section which is to become the channel-forming region. In this manner it is possible to prevent influence of the elemental nickel on the carrier migrating between the source and drain in the channel forming region.

Next, a film of aluminum (containing 0.1 to 2% silicon) is formed by the sputtering method, to a thickness of 6000 to 8000 Å, for example 6000 Å.

Also, the aluminum film is patterned to form gate electrodes 307, 309. Then, the surfaces of these aluminum electrodes are subjected to anodization to form oxide layers 308, 310. This anodization was performed in an ethylene glycol solution which contained 1 to 5% tartaric acid. The thickness of each of the resulting oxide layers 308, 310 was 2000 Å. In the following ion doping step, these oxide layers 308 and 310 are thick enough to form offset gate regions, and thus the lengths of the offset gate regions may be determined in the above anodization step.

Next, an impurity is added by the ion doping method (ion implantation method) to impart one conductive type to the active layer regions (making up the source/drain and the channel). In this doping step, impurities (phosphorus and boron) are implanted using the gate electrode 307 and its surrounding oxide layer 308 and the gate electrode 309 and its surrounding oxide layer 310 as masks. The doping gas used is phosphine ($PH_3$) or diborane ($B_2H_6$), and in the former case the acceleration voltage is 60 to 90 kV, for example 80 kV, and in the latter case it is 40 to 80 kV, for example 65 kV. The dose is $1 \times 10^{15}$ to $8 \times 10^{15}$ $cm^{-2}$, for example $2 \times 10^{15}$ $cm^{-2}$ of phosphorus and $5 \times 10^{15}$ $cm^{-2}$ of boron. During the doping, each of the elements is selectively doped by covering the other region with a photoresist. As a result, N-type impurity regions 314 and 316 are formed, and P-type impurity regions 311 and 313 are formed, and thus it is possible to form P-channel type TFT (PTFT) regions and N-channel type TFT (NTFT) regions.

Then, annealing is performed by irradiation with laser light. The laser light used was from a KrF excimer laser (wavelength: 248 nm, pulse width: 20 nsec), but other lasers may be used. The conditions of the laser light irradiation are an energy density of 200 to 400 $mJ/cm^2$, for example 250 $mJ/cm^2$, and irradiation with 2 to 10 shots, for example 2 shots per location. It is useful to heat the substrate to about 200 to 450° C. at the time of laser irradiation. Since in this laser annealing process nickel is dispersed in the precrystallized regions, the laser light irradiation readily promotes recrystallization, and the impurity regions 311 and 313 doped with P-type-imparting impurities and the impurity regions 314 and 316 doped with N-type-imparting impurities may be easily activated.

This step may be a method of lamp annealing using infrared rays (for example, 1.2 μm). Infrared rays are readily absorbed by silicon and thus effective annealing equal to thermal annealing at 1000° C. or higher may be performed. On the other hand, since they are poorly absorbed by the glass substrate there is no high-temperature heating of the glass substrate and treatment may be finished within a short period of time, for which reasons this may be said to be the ideal method for processes in which there is shrinkage of the glass substrate.

Next, a silicon oxide film 318 of thickness 6000 Å is formed by the plasma CVD method as an interlayer insulator, contact holes are formed therein, and TFT electrodes/ wiring 317, 320, 319 are formed by a multi-layered film of a metallic material, for example, titanium nitride and aluminum. Finally, annealing is performed at 350° C. for 30 minutes in a hydrogen atmosphere at 1 atmospheric pressure, to complete the semiconductor circuit constructed with complementary TFTs (FIG. 10(D)).

The circuit described above has a CMOS structure with the PTFT and NTFT provided in a complementary manner, but in the above process, two TFTs may be simultaneously constructed and bisected to simultaneously prepare two separate TFTs.

Figure 10A:
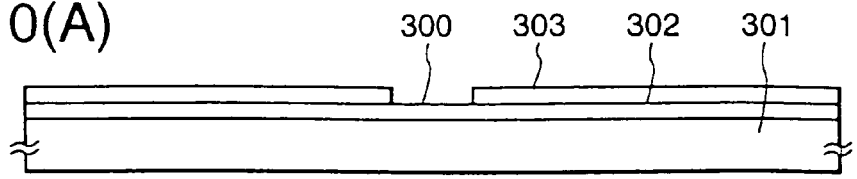
FIGS. 10A–D show the steps of preparation in an example.
Figure 10B:
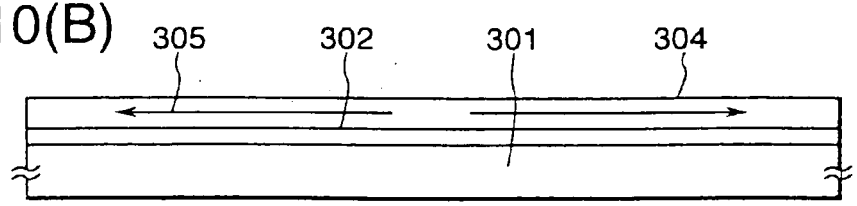
Figure 10C:
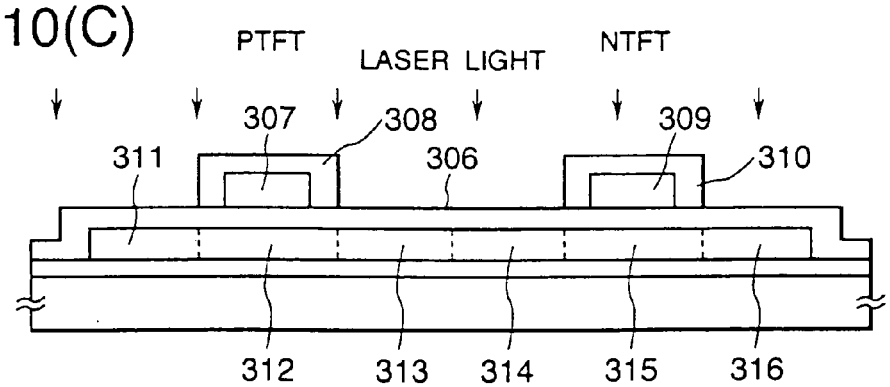
Figure 10D:
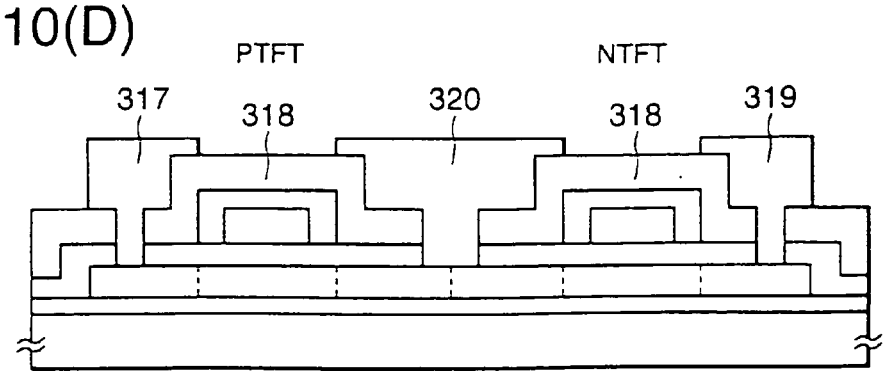
Figure 11:
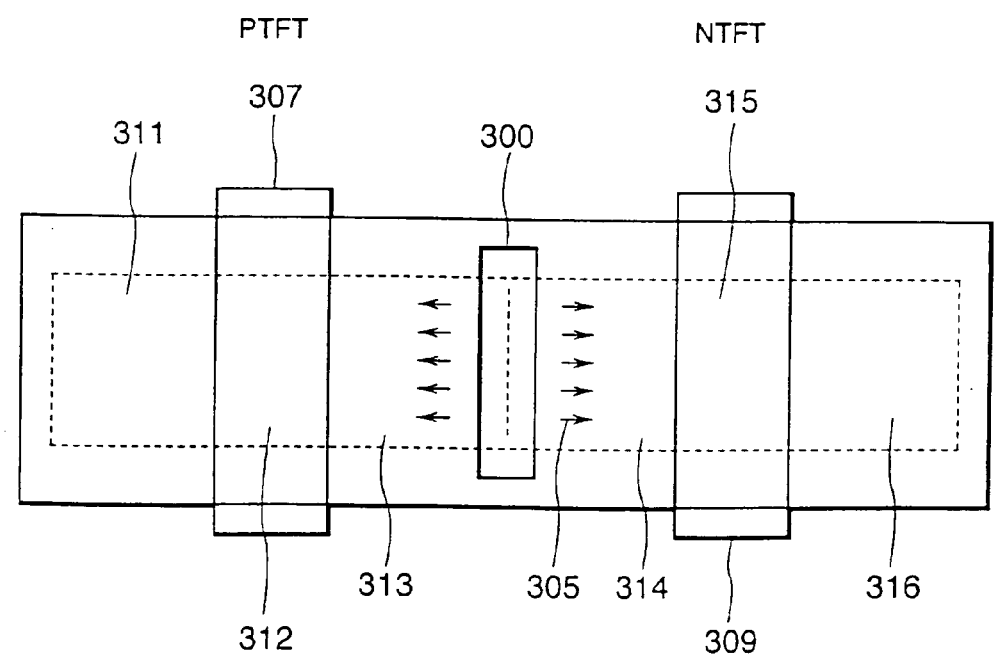
FIG. 11 is an outline sketch relating in an example.

FIG. 11 shows an outline as seen from the top of FIG. 10(D). The symbols in FIG. 11 correspond to those in FIG. 10. As shown in FIG. 11, the direction of crystallization is in the direction shown by the arrow, and crystal growth occurs in the direction of the source/drain regions (direction of a line between the source region and the drain region). During operation of a TFT with this construction, the carrier migrates along the crystals which have grown in a needle-like or columnar manner between the source and the drain. That is, the carrier migrates along the crystalline grain boundary of the needle-like or columnar crystals. Consequently, it is possible to lower the resistance undergone when the carrier migrates, and obtain a TFT with a high degree of mobility.

In this example, the method employed to introduce the nickel was one in which nickel was used to selectively form a nickel film on the underlying film 302 under the amorphous silicon film 304 (since the film is very thin, it is not easily discernible as a film), and crystal growth was induced from that section, but the method may also be one in which a nickel silicide film is selectively formed after formation of the amorphous silicon film 304. That is, the crystal growth may be induced from either the top surface or the bottom of the amorphous silicon film. Furthermore, the method employed may also be one in which an amorphous silicon film is formed in advance, and ion doping is used to selectively implant nickel ion in the amorphous silicon film 304. This method is characterized in that the concentration of the elemental nickel may be controlled. Alternatively, the method may be plasma treatment or CVD.

Example 10

This example is an case of an active-type liquid crystal display provided with N channel-type TFTs as switching elements for each of the picture elements. The following is an explanation regarding a single picture element, but a plurality (usually several hundreds of thousands) of picture elements are formed with the same construction. Also, it need not be mentioned that a P channel-type rather than an N channel-type may be used. Furthermore, it may be used in the peripheral circuit section instead of the picture element section of the liquid crystal display. It may also be employed in an image sensor or any other type of device. In other words, there is no particular restriction on its use so long as it is used as a thin-film transistor.

An outline of the preparation steps for this example is shown in FIG. 12. In this example a Corning 7059 glass plate (thickness 1.1 mm, 300×400 mm) was used as the glass substrate 401. First, an underlying film 402 (silicon oxide) is formed to a thickness of 2000 Å by the sputtering method. Then, for selective introduction of nickel, a mask 403 is formed by a metal mask, a silicon oxide film, photoresist, or the like. A nickel silicide film is also formed by the sputtering method. This nickel silicide film is formed by the sputtering method to a thickness of 5 to 200 Å, for example 20 Å. The nickel silicide film has a chemical formula of $NiSi_x$, where $0.4 \leq x \leq 2.5$, for example x=2.0. Thus there is selectively formed a nickel silicide film over the region of 404.

An amorphous silicon film 405 is then formed to a thickness of 1000 Å by the LPCVD method or the plasma CVD method, and dehydrogenated at 400° C. for one hour, after which it is crystallized by thermal annealing. The annealing process was conducted at 550° C. for 4 hours in a hydrogen reduction atmosphere (preferably with a hydrogen partial pressure of 0.1 to 1 atmosphere). The thermal annealing process may also be carried out in an inert atmosphere of nitrogen or the like.

In this annealing process, since a nickel silicide film has been formed on the part of the region under the amorphous silicon film 405, crystallization starts at this section. During the crystallization, as shown by the arrow in FIG. 12(B), crystal growth of the silicon progresses in a direction vertical to the substrate 401 at the section 404 where the nickel silicide film has been formed. In addition, as also shown by another arrow, in the regions on which the nickel silicide film has not been formed (the regions other than region 405), crystal growth occurs in a parallel manner with respect to the substrate.

Figure 12A:
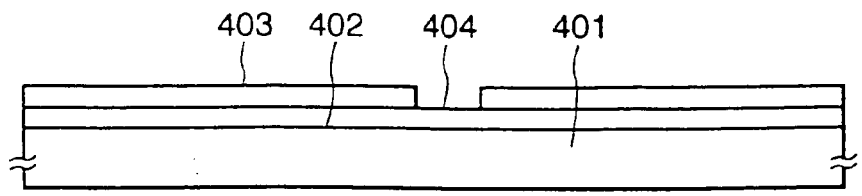
FIGS. 12A–D show the steps of preparation in an example.
Figure 12B:
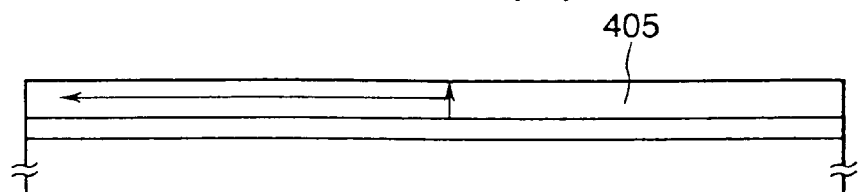
Figure 12C:
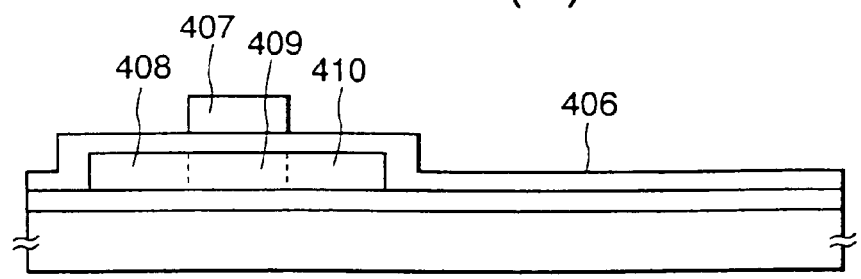
Figure 12D:
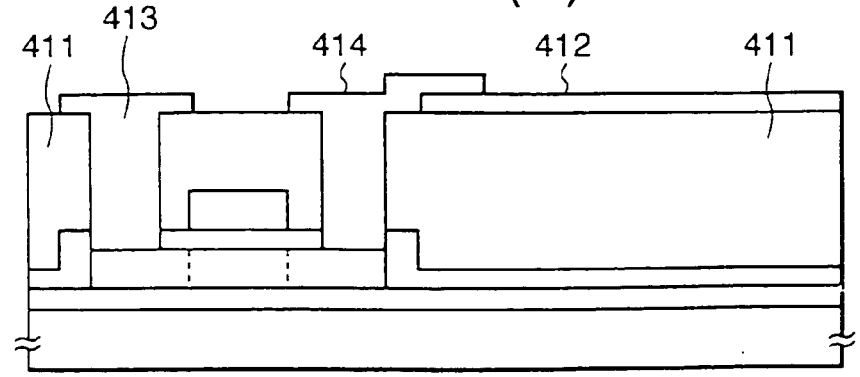

In this manner it is possible to obtain a semiconductor film 405 comprising crystalline silicon. Next, the above mentioned semiconductor film 405 is patterned to form an island semiconductor region (active layer of the TFT). Here, it is important that no front of crystal growth such as indicated by the arrow be present in the active layer, particularly the channel-forming region. Specifically, if the front section indicated by the arrow in FIG. 12(B) is the end (front) of the crystal growth, then it is useful to remove the crystalline silicon film 405 at the section of nickel introduction 404 and the section at the end of the arrow (left edge of the drawing) by etching, and to use the intermediate sections of crystal growth of the crystalline silicon film 405 in a direction parallel to the substrate as the active layer. This is based on the fact that the nickel is concentrated at the front sections of the crystal growth, and is to prevent the adverse effects of the nickel concentrated at the front section on the characteristics of the TFT.

Also, a silicon oxide gate insulation film (thickness: 70 to 120 nm typically 100 nm) 406 is formed by the plasma CVD method in an oxygen atmosphere, using tetraethoxysilane (TEOS) as the starting material. The temperature of the substrate is set to 400° C. or lower, and preferably 200 to 350° C., to prevent shrinkage and warpage of the glass.

Next, a publicly known film consisting mainly of silicon is formed by the CVD method, and it is patterned to form a gate electrode 407. Then, phosphorus is doped by ion implantation as an N-type impurity, and a source region 408, channel-forming region 409 and drain region 410 are formed in a self-aligning manner. Then it is irradiated with KrF laser light to improve the crystallinity of the silicon film whose crystallinity had been impaired by the ion implantation. Here the energy density of the laser light is set to 250 to 300 $mJ/cm^2$. As a result of this laser irradiation, the sheet resistance of the source/drain of this TFT is 300 to 800 $\Omega/cm^2$. The annealing step may also be effectively carried out by infrared lamp annealing.

Next, an interlayer insulator 411 is formed with silicon oxide, and a picture element electrode 412 is formed with an ITO. In addition, contact holes are formed therein, electrodes 413, 414 are formed in the source/drain regions of the TFT using a chrome/aluminum multi-layer film, and one of the electrodes 413 is also connected to the ITO 412. Finally, annealing is performed in hydrogen at 200 to 300° C. for 2 hours to complete the hydrogenation of the silicon. Thus, the TFT is completed. This process is carried out simultaneously for the other picture element regions.

The TFT prepared in this example uses a crystalline silicon film in which crystal growth has occurred in the direction of flow of the carrier, as the active layer making up the source region, channel-forming region and drain region, and thus since the carrier migrates along the crystal grain boundary of the needle-like or columnar crystals, without intersecting the crystal grain boundary, the resulting TFT has a carrier with a high degree of mobility. The TFT prepared in this example was an N channel-type, and its degree of mobility was 90 to 130 ($cm^2/Vs$). Considering that the mobility of N channel-type TFTs using crystalline silicon obtained by crystallization with conventional thermal annealing at 600° C. for 48 hours has been 80 to 100 ($cm^2/Vs$), the improvement in the properties is notable.

Also, the degree of mobility of a P channel-type TFT prepared by a method similar to the above process was measured and found to be 50 to 80 ($cm^2/Vs$). This is also a notable improvement in the properties, considering that the mobility of P channel-type TFTs using crystalline silicon films obtained by crystallization with conventional thermal annealing at 600° C. for 48 hours has been 30 to 60 ($cm^2/Vs$).

Example 11

This is a modification of the TFT in Example 10 which is provided with a source/drain in a perpendicular direction with respect to the direction of crystal growth. That is, it is a case with a construction in which the direction of migration of the carrier is perpendicular to the direction of crystal growth, and thus the migration of the carrier intersects the crystal grain boundary of the needle-like or columnar crystals. With this type of construction, the resistance between the source and the drain may be increased. This is because the carrier must migrate so that it intersects the crystal grain boundary of the needle-like or columnar crystals. To achieve the construction of this example, it is only necessary to determine the orientation of the TFT in the construction in Example 10.

Example 12

The main aspect of this example lies in the fact that the orientation of the TFT in the construction in Example 10 (Here, the orientation is defined by the connecting line between the source/drain regions. That is, the direction of the TFT is determined by the orientation of the carrier flow.) is set at a desired angle with the direction of crystal growth of the crystalline silicon film with respect to the surface of the substrate, for selection of the properties of the TFT.

As described above, if the carrier is allowed to migrate in the direction of the crystal growth, then it will migrate along the crystal grain boundary, and consequently the degree of mobility thereof will be improved. On the other hand, if the carrier is allowed to migrate perpendicularly with respect to the direction of the crystal growth, then the carrier must intersect multiple grain boundaries, and thus the degree of mobility of the carrier will be reduced.

Here, through appropriate selection between these two conditions, that is, by setting the angle between the direction of crystal growth and the direction of migration of the carrier within a range of 0 to 90°, it is possible to control the mobility of the carrier. Viewed differently, by setting the above angle between the direction of crystal growth and the direction of migration of the carrier, it becomes possible to control the resistance between the source and drain regions. Naturally, this construction may also be used for the construction in Example 1. In that case, the slit-shaped region 400 of trace addition of nickel shown in FIG. 11 is rotated within a range of 0 to 90° for selection within 0 to 90° of the angle between the direction of crystal growth shown by the arrow 405 and the line connecting the source and drain regions. Also, this angle may be set to near 0° to increase the mobility for a construction with a low degree of electrical resistance between the source and drain regions. Furthermore, the angle may be set to near 90° to lower the mobility for a construction with a high degree of resistance between the source and drain regions.

As mentioned above, for a TFT which employs a non-single crystal silicon semiconductor film formed on a substrate and having crystallinity resulting from crystal growth parallel to the surface of the substrate, the direction of the flow of the carrier migrating in the TFT may be matched to the direction of crystal growth for a construction in which the migration of the carrier is along (parallel to) the crystal grain boundary of the needle-like or columnar crystals, to obtain a TFT with a high degree of mobility.

Furthermore, since the metal catalyst for promotion of crystallization is concentrated at the front sections of the crystal growth parallel to the substrate, a TFT may be formed without using these regions, to increase the operational stability and reliability of the TFT. In addition, by making a semiconductor device using a crystalline silicon film prepared by introduction of a catalytic element for short time crystallization at a low temperature followed by irradiation with laser light or other intense light, it is possible to obtain a device with a high degree of productivity and favorable characteristics.

What is claimed is:

1. A method of manufacturing a semiconductor device comprising the steps of:

forming a semiconductor film comprising amorphous silicon on an insulating surface;

crystallizing said semiconductor film wherein the crystallized semiconductor film exhibits an X-ray diffraction pattern the orientation ratio at (111) plane of which is 0.67 or higher;

patterning said semiconductor film into at least one semiconductor island;

oxidizing a surface of the semiconductor island in an oxidizing atmosphere at a higher pressure than an atmospheric pressure, thereby forming an insulating film comprising silicon oxide on the semiconductor island; and forming a gate electrode over the semiconductor island with the insulating film interposed therebetween.

2. A method of manufacturing a semiconductor device comprising the steps of:

forming a semiconductor film comprising amorphous silicon on an insulating surface;

providing said semiconductor film with a crystallization promoting material for promoting crystallization thereof;

heating said semiconductor film with the crystallization promoting material to crystallize said semiconductor film wherein the crystallized semiconductor film exhibits an X-ray diffraction pattern the orientation ratio at (111) plane of which is 0.67 or higher;

patterning the crystallized semiconductor film into at least one semiconductor island;

oxidizing a surface of the semiconductor island in an oxidizing atmosphere at a higher pressure than an atmospheric pressure, thereby forming an insulating film comprising silicon oxide on the semiconductor island; and forming a gate electrode over the semiconductor island with the insulating film interposed therebetween.

3. A method of manufacturing a semiconductor device comprising the steps of:

forming a semiconductor film comprising amorphous silicon on an insulating surface;

providing a selected portion of said semiconductor film with a crystallization promoting material for promoting crystallization thereof;

heating said semiconductor film with the crystallization promoting material to crystallize said semiconductor film wherein the crystallization proceeds from said selected portion in parallel with said insulating surface and wherein the crystallized semiconductor film exhibits an X-ray diffraction pattern the orientation ratio at (111) plane of which is 0.67 or higher;

patterning the crystallized semiconductor film into at least one semiconductor island;

oxidizing a surface of the semiconductor island in an oxidizing atmosphere at a higher pressure than an atmospheric pressure, thereby forming an insulating film comprising silicon oxide on the semiconductor island; and forming a gate electrode over the semiconductor island with the insulating film interposed therebetween.

4. The method according to claim 2 wherein said crystallization promoting material comprises a metal or a metal compound and said metal is selected from the group consisting of Ni, Pd, Pt, Cu, Ag, Au, In, Sn, Pb, As and Sb.

5. The method according to claim 3 wherein said crystallization promoting material comprises a metal or a metal compound and said metal is selected from the group consisting of Ni, Pd, Pt, Cu, Ag, Au, In, Sn, Pb, As and Sb.

6. The method according to claim 2 wherein said crystallization promoting material contains one or more elements selected from the group consisting of Group VII, IIIb, IVb and Vb elements.

7. The method according to claim 3 wherein said crystallization promoting material contains one or more elements selected from the group consisting of Group VIII, IIIb, IVb and Vb elements.

8. A method of manufacturing a semiconductor device comprising the steps of:

forming a semiconductor film comprising amorphous silicon on an insulating surface;

crystallizing said semiconductor film wherein the crystallized semiconductor film exhibits an X-ray diffraction pattern the orientation ratio at (111) plane of which is 0.67 or higher;

patterning said semiconductor film into at least one semiconductor island;

subjecting the semiconductor island to a heated oxidizing atmosphere at a higher pressure than an atmospheric pressure; and forming a gate electrode over the semiconductor island.

9. A method of manufacturing a semiconductor device comprising the steps of:

forming a semiconductor film comprising amorphous silicon on an insulating surface;

crystallizing said semiconductor film wherein the crystallized semiconductor film exhibits an X-ray diffraction pattern the orientation ratio at (111) plane of which is 0.67 or higher;

oxidizing a surface of the crystallized semiconductor film in an oxidizing atmosphere at a higher pressure than an atmospheric pressure, thereby forming an insulating film comprising silicon oxide on the semiconductor film.

10. A method of manufacturing a semiconductor device comprising the steps of:

forming a semiconductor film comprising amorphous silicon on an insulating surface;

providing said semiconductor film with a crystallization promoting material for promoting crystallization thereof;

heating said semiconductor film with the crystallization promoting material to crystallize said semiconductor film wherein the crystallized semiconductor film exhibits an X-ray diffraction pattern the orientation ratio at (111) plane of which is 0.67 or higher;

oxidizing a surface of the crystallized semiconductor film in an oxidizing atmosphere at a higher pressure than an atmospheric pressure, thereby forming an insulating film comprising silicon oxide on the semiconductor film.

11. The method according to claim 10 wherein said crystallization promoting material comprises a metal or a metal compound and said metal is selected from the group consisting of Ni, Pd, Pt, Cu, Ag, Au, In, Sn, Pb, As and Sb.

12. The method according to claim 10 wherein said crystallization promoting material contains one or more elements selected from the group consisting of Group VIII, IIIb, IVb and Vb elements.

* * * * *